(12) United States Patent
Wang et al.

(10) Patent No.: US 12,356,688 B2
(45) Date of Patent: Jul. 8, 2025

(54) METHOD FOR FORMING SEMICONDUCTOR DEVICE

(71) Applicant: Taiwan Semiconductor Manufacturing Company, Ltd., Hsinchu (TW)

(72) Inventors: Sheng-Tsung Wang, Hsinchu (TW); Huan-Chieh Su, Changhua County (TW); Chun-Yuan Chen, Hsinchu (TW); Lin-Yu Huang, Hsinchu (TW); Min-Hsuan Lu, Hsinchu (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 436 days.

(21) Appl. No.: 17/849,734

(22) Filed: Jun. 27, 2022

(65) Prior Publication Data

US 2023/0420525 A1    Dec. 28, 2023

(51) Int. Cl.
| | |
|---|---|
| *H10D 64/01* | (2025.01) |
| *B82Y 10/00* | (2011.01) |
| *H01L 21/768* | (2006.01) |
| *H01L 23/528* | (2006.01) |
| *H10D 30/01* | (2025.01) |
| *H10D 30/43* | (2025.01) |
| *H10D 30/67* | (2025.01) |
| *H10D 30/69* | (2025.01) |
| *H10D 62/10* | (2025.01) |

(Continued)

(52) U.S. Cl.
CPC ......... *H10D 64/01* (2025.01); *H01L 23/5286* (2013.01); *H10D 30/014* (2025.01); *H10D 30/031* (2025.01); *H10D 30/6729* (2025.01); *H10D 84/0149* (2025.01); *H10D 84/0151* (2025.01); *H10D 84/038* (2025.01); *H01L 21/76898* (2013.01); *H10D 30/43* (2025.01); *H10D 30/6735* (2025.01); *H10D 30/6757* (2025.01)

(58) Field of Classification Search
CPC ..... H01L 21/823475; H01L 21/823481; H01L 23/5286; H01L 23/53204; H01L 21/762; H01L 29/0649; H01L 29/401; H01L 23/5226; H01L 21/743; H01L 23/535; H01L 21/76895; H01L 21/76897; H01L 21/823871; H01L 21/76224
See application file for complete search history.

(56) References Cited

U.S. PATENT DOCUMENTS

| | | | | |
|---|---|---|---|---|
| 2021/0408246 | A1* | 12/2021 | Ganguly | ........... H01L 21/02532 |
| 2023/0093101 | A1* | 3/2023 | Xie | ........................ H10D 30/43 |
| | | | | 257/690 |
| 2023/0420359 | A1* | 12/2023 | Xie | ................... H01L 21/76883 |

* cited by examiner

*Primary Examiner* — Sonya McCall-Shepard
(74) *Attorney, Agent, or Firm* — JCIPRNET

(57) ABSTRACT

A method for forming a semiconductor device includes followings. A transistor is formed, and the transistor is embedded in a dielectric layer and disposed over a semiconductor substrate. A first gate cutting process is performed to form a first opening in the dielectric layer. An insulator post is formed in the first opening. A second gate cutting process is performed to form a second opening in the dielectric layer. A power via is formed in the second opening. A conductor is formed, wherein the conductor is embedded in the semiconductor substrate, and the conductor is located under and electrically connected to the power via.

20 Claims, 31 Drawing Sheets

(51) Int. Cl.
*H10D 62/822* (2025.01)
*H10D 84/01* (2025.01)
*H10D 84/03* (2025.01)

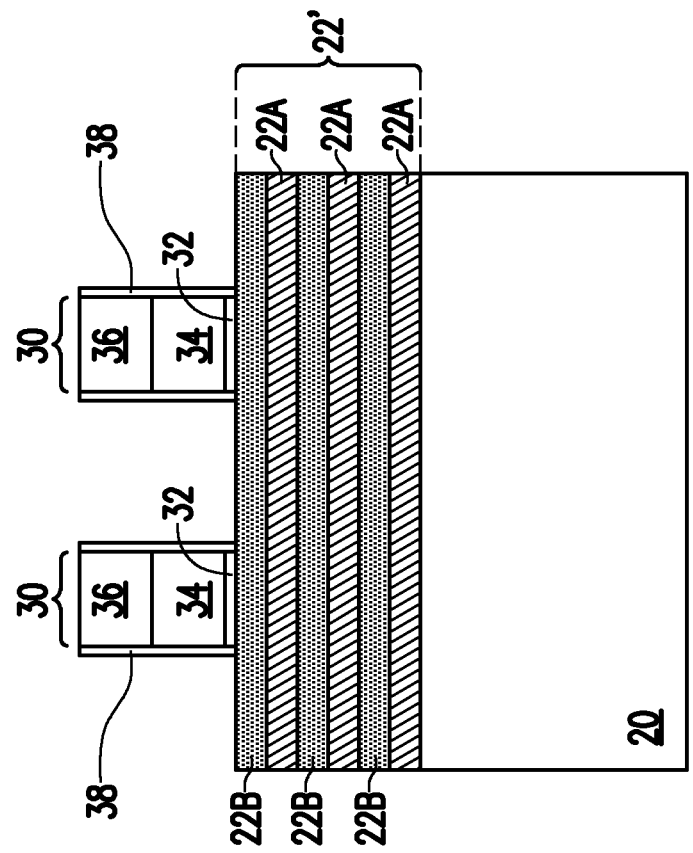
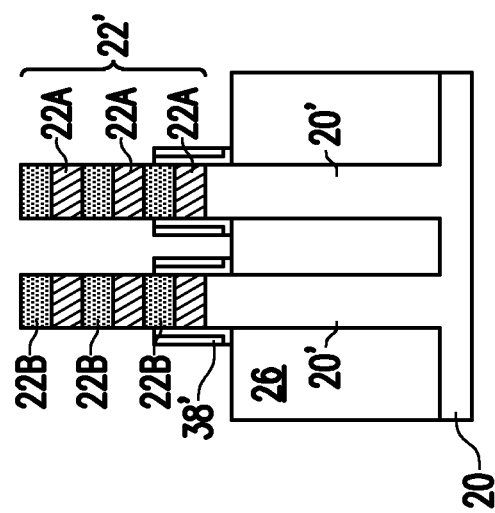
FIG. 5B
FIG. 5A

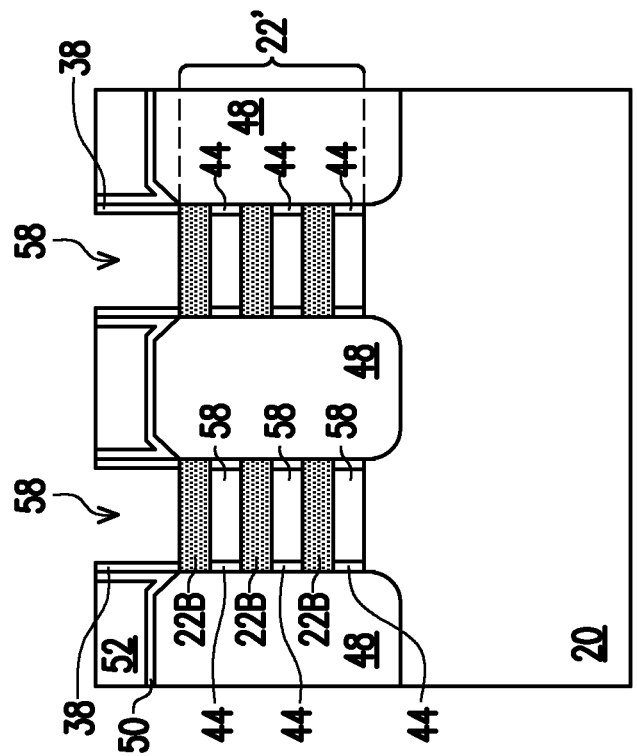
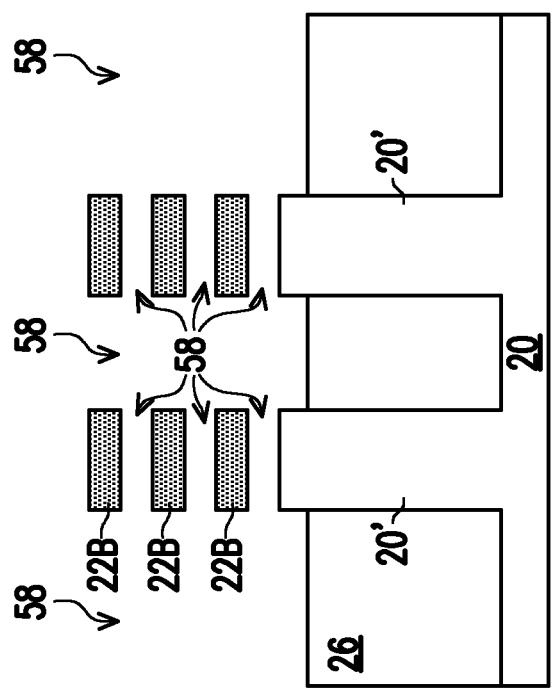
FIG. 13B
FIG. 13A

METHOD FOR FORMING SEMICONDUCTOR DEVICE

BACKGROUND

In currently performed chip fabrication processes, all signal and power rail are placed at the front-side routings formed on the front surface of the semiconductor substrate, however, as cell height scaling, the process window (e.g., the space between the front-side routings and dimension of the power rail) will be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 11A, 11B, 12A, 12B, 13A, 13B, 14A, 14B, 15A, and 15B illustrate the cross-sectional views of intermediate stages in the formation of gate-all-around (GAA) transistors in accordance with some embodiments.

DETAILED DESCRIPTION

Figure 1:
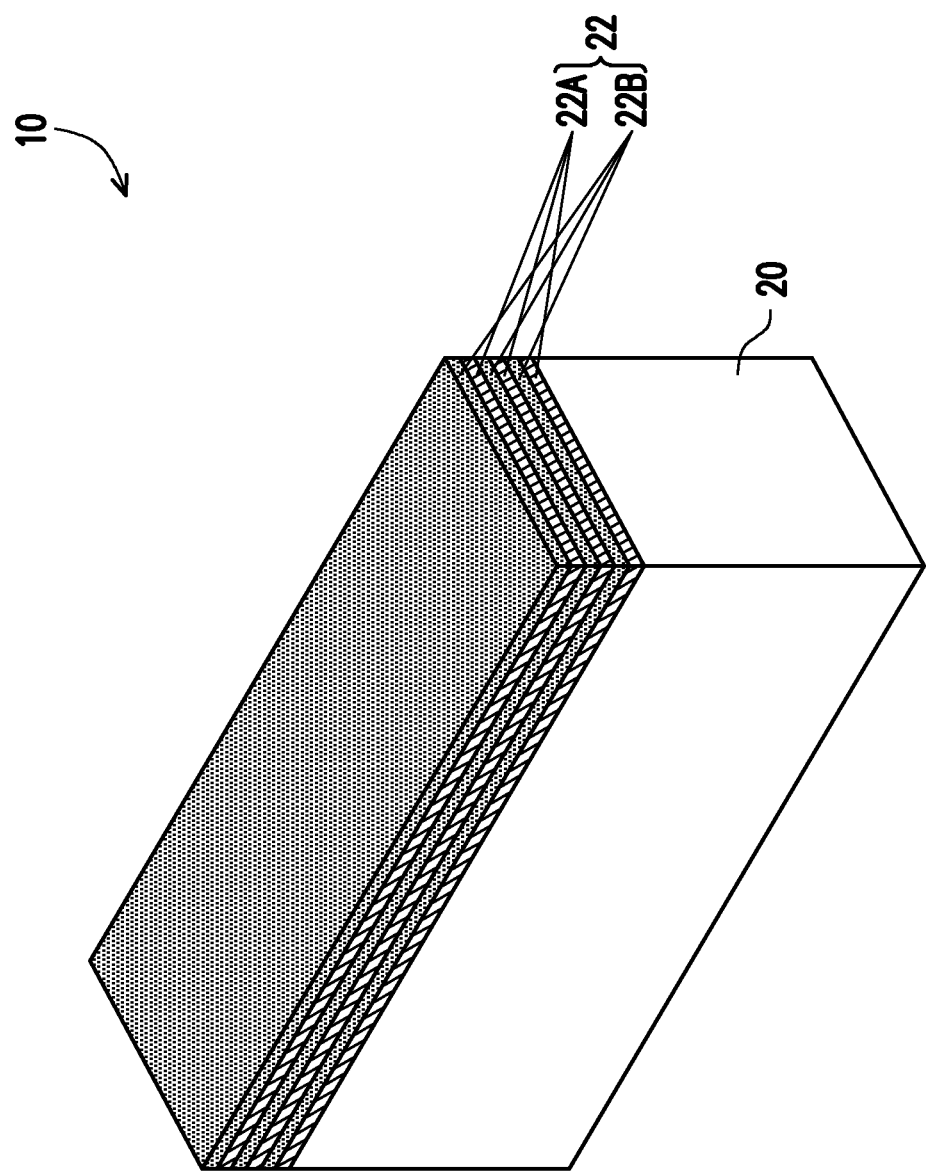

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor device with power vias are provided, wherein the power source is applied to the power vias from the backside of the semiconductor device. Since the power vias electrically connect front-side metal routings (e.g., metal drain (MD)) and backside power source, power efficiency and routing flexibility of the front-side routings can be enhanced.

FIGS. 1-4, 5A, 5B, 6A, 6B, 7A, 7B, 8A, 8B, 9A, 9B, 10A, 10B, 11A, 11B, 12A, 12B, 13A, 13B, 14A, 14B, 15A, and 15B illustrate the cross-sectional views of intermediate stages in the formation of GAA transistors in accordance with some embodiments.

Referring to FIG. 1, a perspective view of a wafer 10 is shown. The wafer 10 includes a multilayer structure comprising a multilayer stack 22 on the substrate 20. In accordance with some embodiments, the substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. The substrate 20 may be doped as a p-type semiconductor, although in other embodiments, it may be doped as an n-type semiconductor.

In accordance with some embodiments, the multilayer stack 22 is formed through a series of deposition processes for depositing alternating materials. In accordance with some embodiments, the multilayer stack 22 comprises first layers 22A formed of a first semiconductor material and second layers 22B formed of a second semiconductor material different from the first semiconductor material.

In accordance with some embodiments, the first layers 22A is formed of or comprises a first semiconductor material such as SiGe, Ge, Si, GaAs, InSb, GaSb, InAlAs, InGaAs, GaSbP, GaAsSb, or the like. In accordance with some embodiments, the deposition of the first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layers 22A are formed to a first thickness in the range between about 30 Å and about 300 Å. However, any suitable thickness may be utilized while remaining within the scope of the embodiments.

Once a first layer 22A has been deposited over the substrate 20, a second layer 22B is deposited over the deposited first layer 22A. In accordance with some embodiments, the second layers 22B are formed of or comprises a second semiconductor material such as Si, SiGe, Ge, GaAs, InSb, GaSb, InAlAs, InGaAs, GaSbP, GaAsSb, combinations of these, or the like. The second semiconductor material of the second layers 22B is different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layers 22B are epitaxially grown on the respective first layers 22A using a deposition technique similar to that is used to form the first layers 22A. In accordance with some embodiments, the second layers 22B are formed to a similar thickness to that of the first layers 22A. The second layers 22B may also be formed to a thickness that is different from the first layers 22A. In accordance with some embodiments, the second layers 22B may be formed to a second thickness in the range between about 10 Å and about 500 Å, for example.

In accordance with some embodiments, the first layers 22A have thicknesses the same as or similar to each other, and the second layers 22B have thicknesses the same as or similar to each other. The first layers 22A may also have the same thicknesses as, or different thicknesses from, that of the second layers 22B. In accordance with some embodiments, the first layers 22A are removed in the subsequent processes, and are alternatively referred to as sacrificial layers 22A throughout the description. In accordance with alternative embodiments, the second layers 22B are sacrificial, and are removed in the subsequent processes.

In accordance with some embodiments, there are some pad oxide layer(s) and hard mask layer(s) (not shown) formed over the multilayer stack 22. These layers are patterned and are used for the subsequent patterning of the multilayer stack 22.

Figure 2:
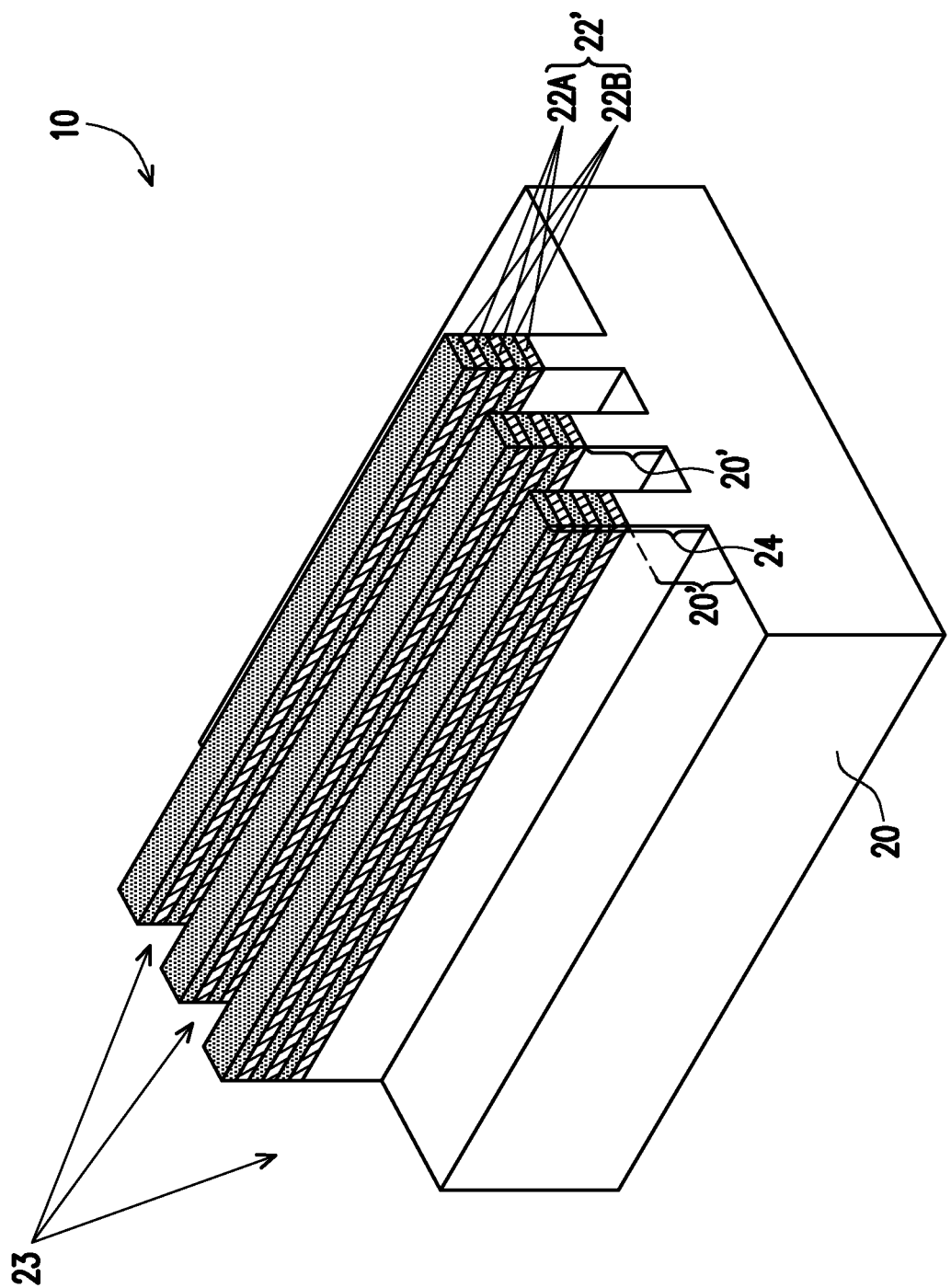

Referring to FIG. 2, the multilayer stack 22 and a portion of the underlying substrate 20 are patterned in an etching process, so that trenches 23 are formed. The trenches 23 extend into the substrate 20. The remaining portions of multilayer stacks are referred to as multilayer stacks 22' hereinafter. Underlying the multilayer stacks 22', some portions of the substrate 20 are left, and are referred to as substrate strips 20' hereinafter. The multilayer stacks 22' include patterned semiconductor layers 22A and 22B. The patterned semiconductor layers 22A are alternatively referred to as sacrificial layers, and the patterned semiconductor layers 22B are alternatively referred to as nanostructures hereinafter. The portions of the multilayer stacks 22' and the underlying substrate strips 20' are collectively referred to as semiconductor strips 24.

In above-illustrated embodiments, the structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
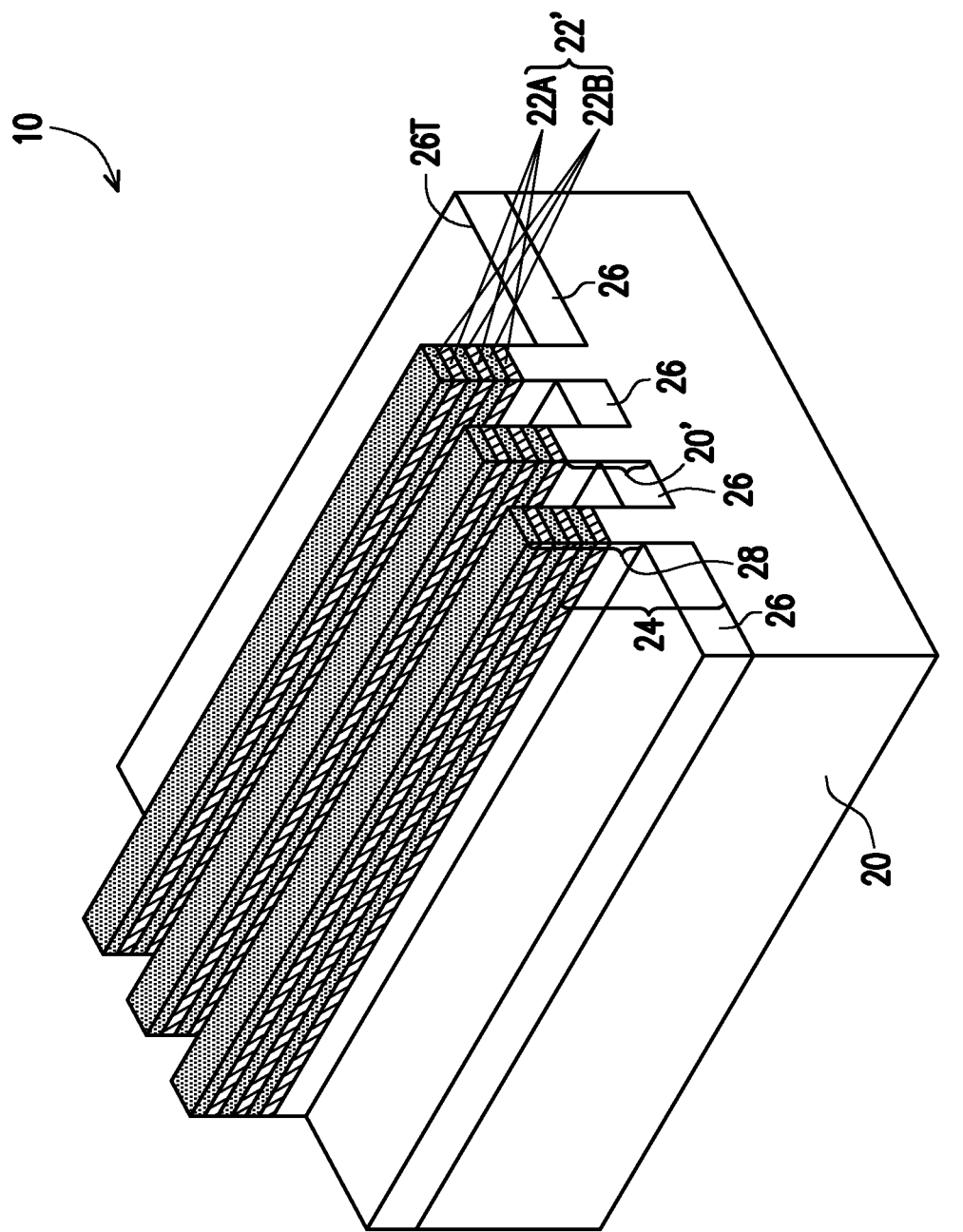

FIG. 3 illustrates the formation of isolation regions 26, which are also referred to as Shallow Trench Isolation (STI) regions throughout the description. The STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. The STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are the STI regions 26.

The STI regions 26 are then recessed, so that the top portions of the semiconductor strips 24 protrude higher than the top surfaces 26T of the remaining portions of the STI regions 26 to form protruding fins 28. The protruding fins 28 include the multilayer stacks 22' and may include the top portions of the substrate strips 20'. The recessing of the STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of the STI regions 26 is performed through a wet etching process. The etching chemical may include HF, for example.

Figure 4:
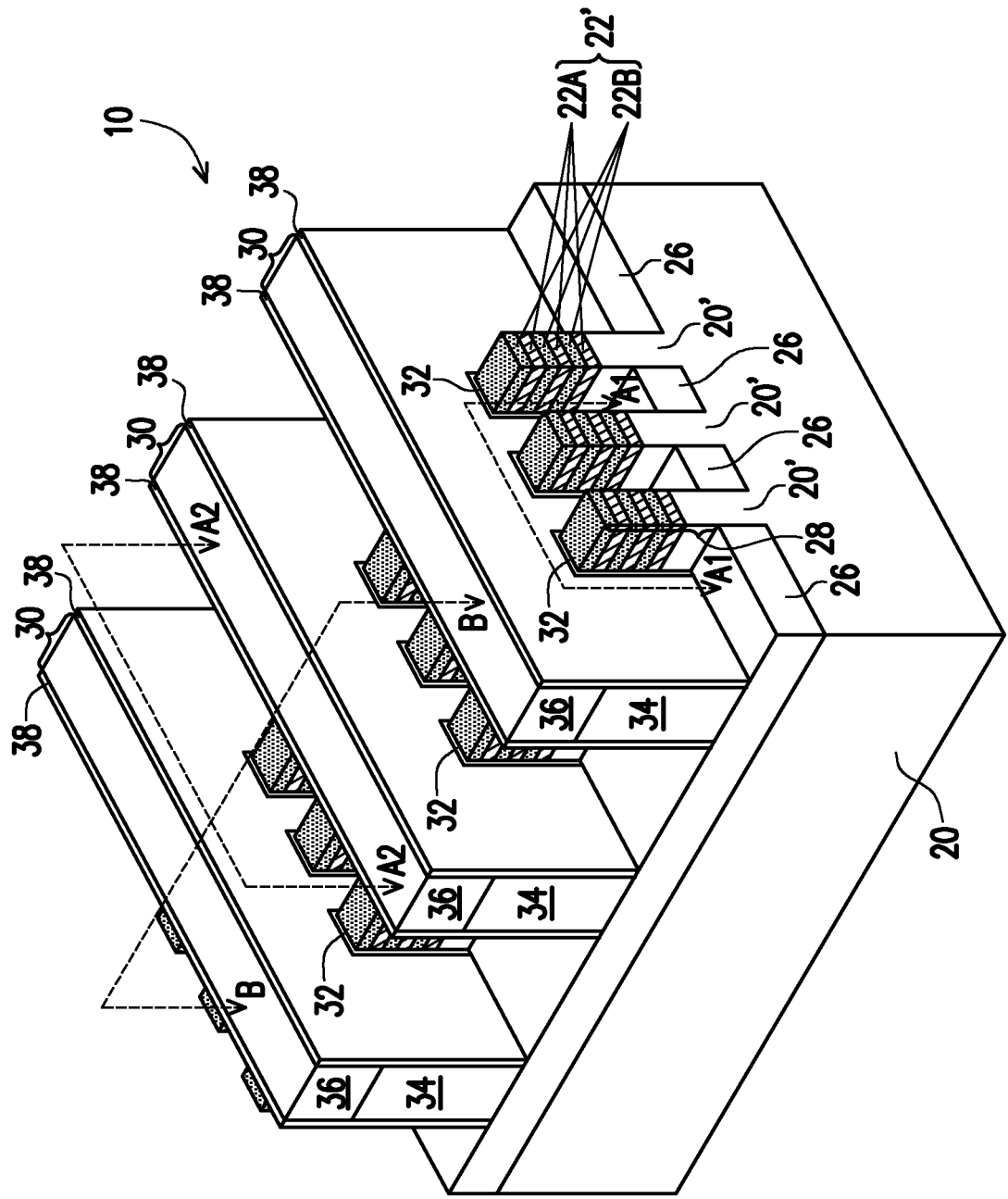

Referring to FIG. 4, dummy gate stacks 30 and gate spacers 38 are formed on the top surfaces and the sidewalls of the protruding fins 28. Dummy gate stacks 30 may include dummy gate dielectrics 32 and dummy gate electrodes 34 over the dummy gate dielectrics 32. The dummy gate dielectrics 32 may be formed by oxidizing the surface portions of the protruding fins 28 to form oxide layers, or by depositing a dielectric layer such as a silicon oxide layer. The dummy gate electrodes 34 may be formed, for example, using polysilicon or amorphous silicon, and other materials such as amorphous carbon may also be used. Each of the dummy gate stacks 30 may also include a hard mask layer 36 over the dummy gate electrode 34. The hard mask layers 36 may be formed of silicon nitride, silicon oxide, silicon carbo-nitride, silicon oxy-carbo nitride, or multilayers thereof. The dummy gate stacks 30 may cross over a single one or a plurality of protruding fins 28 and the STI regions 26 between the protruding fins 28. The dummy gate stacks 30 also have lengthwise directions perpendicular to the lengthwise directions of the protruding fins 28. The formation of the dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, the gate spacers 38 are formed on the sidewalls of the dummy gate stacks 30. In accordance with some embodiments of the present disclosure, the gate spacers 38 are formed of a dielectric material such as silicon nitride (SiN), silicon oxide (SiO2), silicon carbo-nitride (SiCN), silicon oxynitride (SiON), silicon oxy-carbo-nitride (SiOCN), or the like, and may have a single-layer structure or a multi-layer structure including a plurality of dielectric layers. The formation process of the gate spacers 38 may include depositing one or a plurality of dielectric layers, and then performing an anisotropic etching process(es) on the dielectric layer(s). The remaining portions of the dielectric layer(s) are the gate spacers 38.

FIGS. 5A and 5B illustrate the cross-sectional views of the structure shown in FIG. 4. FIG. 5A illustrates the reference cross-section A1-A1 in FIG. 4, which cross-section cuts through the portions of the protruding fins 28 not covered by the gate stacks 30 and the gate spacers 38, and is perpendicular to the gate-length direction. Fin spacers 38', which are on the sidewalls of protruding fins 28, are also illustrated. FIG. 5B illustrates the reference cross-section B-B in FIG. 4, which reference cross-section is parallel to the lengthwise directions of the protruding fins 28.

Figure 6B:
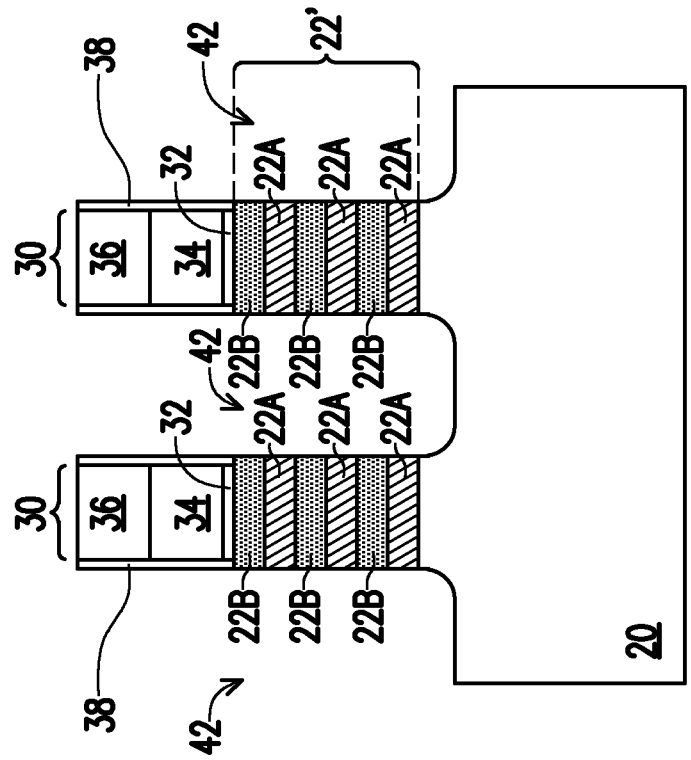
Figure 6A:
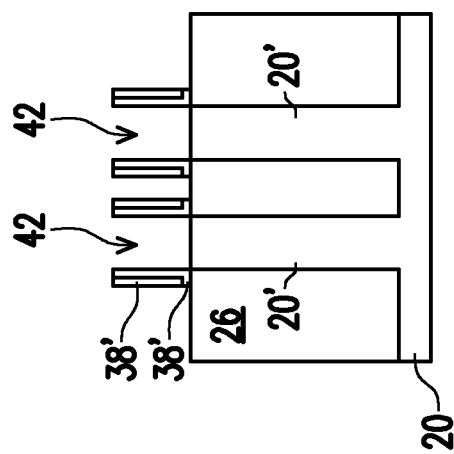

Referring to FIGS. 6A and 6B, the portions of the protruding fins 28 that are not directly underlying the dummy gate stacks 30 and the gate spacers 38 are recessed through an etching process to form recesses 42. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch the multilayer semiconductor stacks 22' and the underlying substrate strips 20'. The bottoms of the recesses 42 are at least level with or may be lower than (as shown in FIG. 6B), the bottoms of the multilayer semiconductor stacks 22'. The etching may be anisotropic, so that the sidewalls of the multilayer semiconductor stacks 22' facing the recesses 42 are substantially vertical and straight, as shown in FIG. 6B.

Figure 7B:
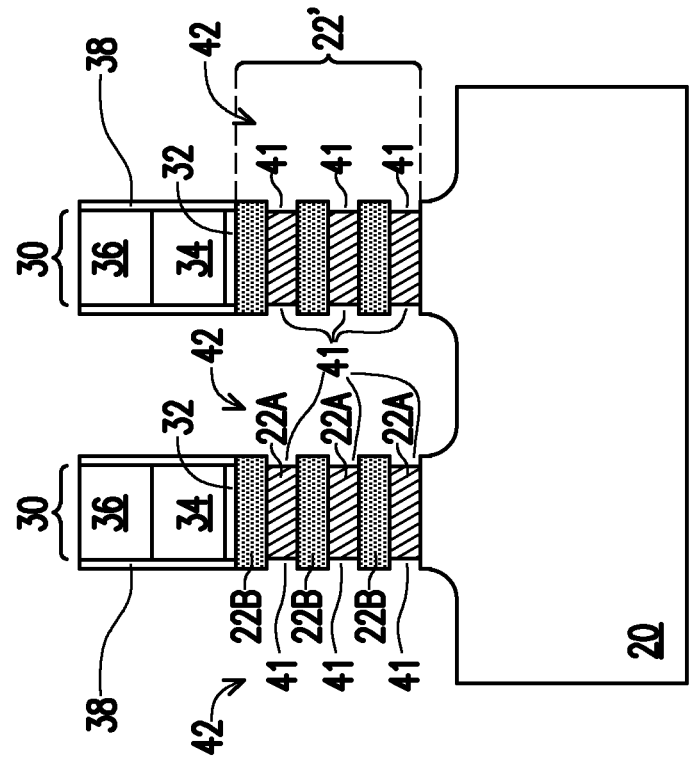
Figure 7A:
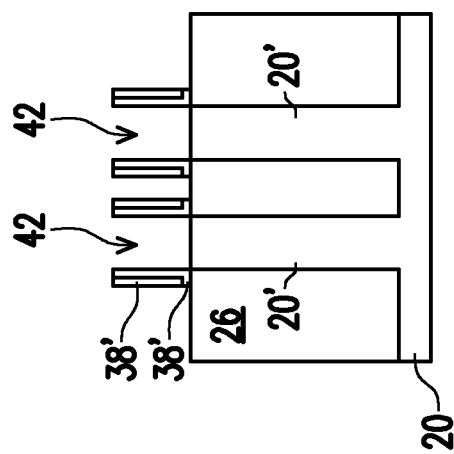

Referring to FIGS. 7A and 7B, the sacrificial semiconductor layers 22A are laterally recessed to form lateral recesses 41, which are recessed from the edges of the respective overlying and underlying nanostructures 22B. The lateral recessing of the sacrificial semiconductor layers 22A may be achieved through a wet etching process using an etchant that is more selective to the material (for example, silicon germanium (SiGe)) of the sacrificial semiconductor layers 22A than the material (for example, silicon (Si)) of the nanostructures 22B and the substrate 20. For example, in an embodiment in which the sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, a spin-on process, or the like, and may be performed using any suitable process temperatures (for example, between about 400° C. and about 600° C.). In accordance with alternative embodiments, the lateral recessing of the sacrificial semiconductor layers 22A is performed through an isotropic dry etching process or a combination of a dry etching process and a wet etching process.

Figure 8B:
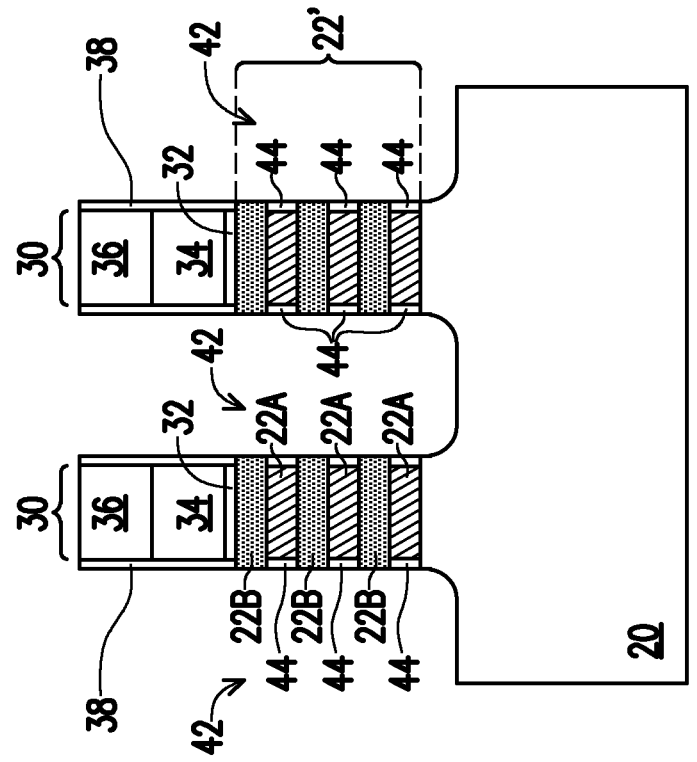
Figure 8A:
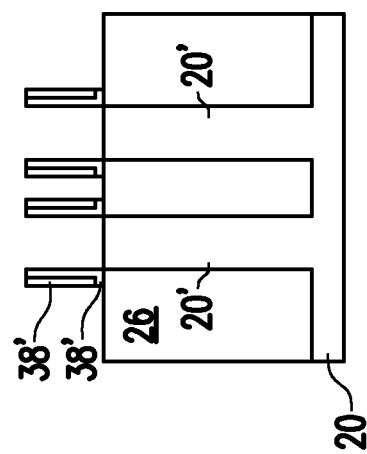

Referring to FIGS. 8A and 8B, inner spacers 44 are formed in the lateral recesses 41. The inner spacers 44 act as isolation features between subsequently formed source/drain regions and a gate structure. The formation process may include depositing a conformal dielectric layer and then trimming the conformal dielectric layer. The conformal dielectric layer of the inner spacer 44 may be deposited by a conformal deposition process, such as CVD, ALD, or the like. The conformal dielectric layer may comprise a material such as silicon nitride or silicon oxynitride, although any suitable material, such as low-dielectric constant (low-k) materials having a k-value less than about 3.5, may be utilized. The conformal dielectric layer may then be anisotropically etched to form the inner spacers 44.

Figure 9B:
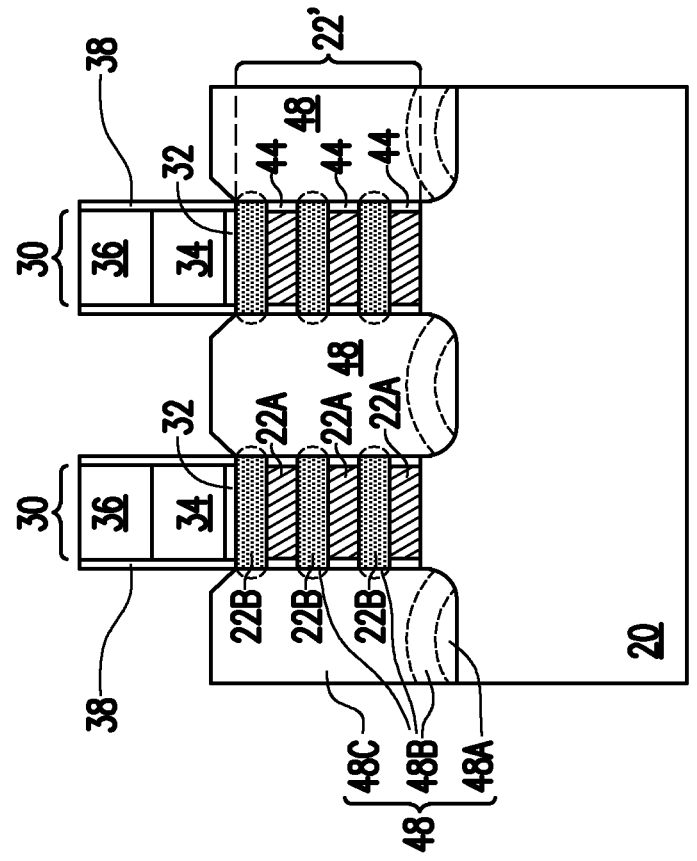

Although the inner sidewalls and the outer sidewalls of the inner spacers 44 are schematically illustrated as being straight in FIG. 9B, the inner sidewalls of the inner spacers 44 may be convex, and the outer sidewalls of the inner spacers 44 may be concave or convex. The inner spacers 44 may be used to prevent damage to subsequently formed source/drain regions, which damage may be caused by subsequent etching processes for forming replacement gate structures.

Figure 9A:
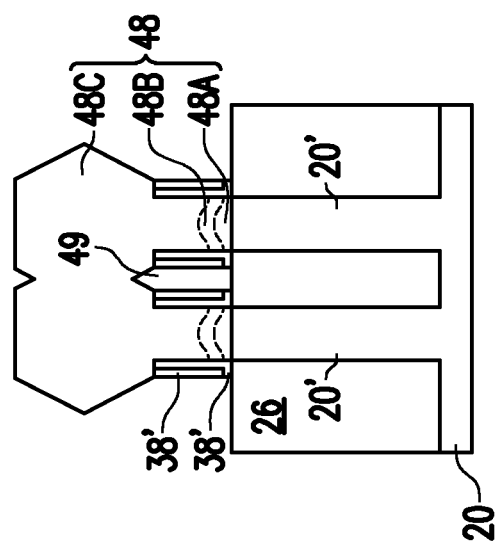

Referring to FIGS. 9A and 9B, epitaxial source/drain regions 48 are formed in the recesses 42. In accordance with some embodiments, the source/drain regions 48 may exert stress on the nanostructures 22B, which are used as the channels of the corresponding GAA transistors, thereby improving device performance. Depending on whether the resulting transistor is a p-type transistor or an n-type transistor, a p-type or an n-type impurity may be in-situ doped with the proceeding of the epitaxy. For example, when the resulting transistor is a p-type Transistor, silicon germanium boron (SiGeB), silicon boron (SiB), or the like may be grown. Conversely, when the resulting transistor is an n-type Transistor, silicon phosphorous (SiP), silicon carbon phosphorous (SiCP), or the like may be grown. After the recesses 42 are filled with the epitaxy regions 48, the further epitaxial growth of the epitaxy regions 48 causes the epitaxy regions 48 to expand horizontally, and facets may be formed. The further growth of the epitaxy regions 48 may also cause the neighboring epitaxy regions 48 to merge with each other. Voids (air gaps) 49 illustrated in FIG. 9A may be generated.

The epitaxy regions 48 may include a plurality of sub-layers, which are denoted as 48A, 48B, and 48C in accordance with some embodiments. The sub-layers have different concentrations/atomic percentage of silicon, germanium, carbon, and dopant.

After the epitaxy process, the epitaxy regions 48 may be further implanted with a p-type or an n-type impurity to form source and drain regions, which are also denoted using reference numeral 48. In accordance with alternative embodiments of the present disclosure, the implantation process is skipped when the epitaxy regions 48 are in-situ doped with the p-type or n-type impurity during the epitaxy, and the epitaxy regions 48 are also source/drain regions.

Figure 10B:
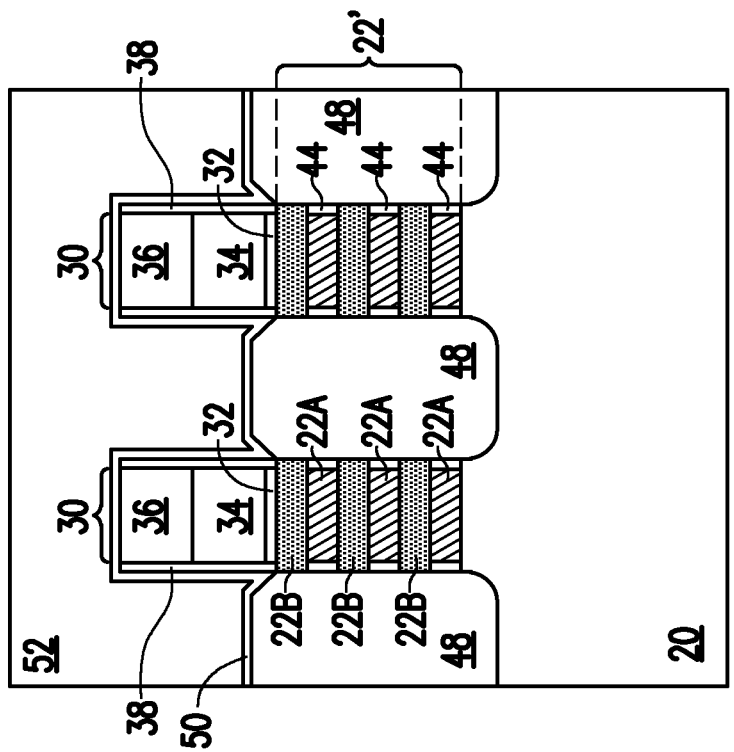
Figure 10A:
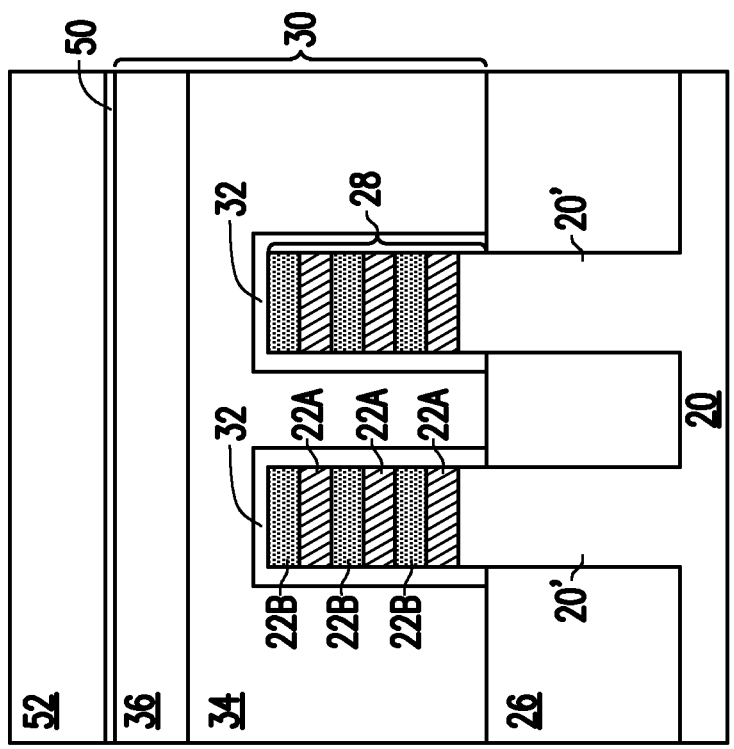

FIGS. 10A and 10B illustrate the cross-sectional views of the structure after the formation of CESL 50 and ILD 52. FIG. 1 OA illustrates the reference cross-section A2-A2 in FIG. 4, after the formation of the CESL 50 and the ILD 52. The CESL 50 may be formed of silicon oxide, silicon nitride, silicon carbo-nitride, or the like, and may be formed using CVD, ALD, or the like. The ILD 52 may include a dielectric material formed using, for example, FCVD, spin-on coating, CVD, or any other suitable deposition method. The ILD 52 may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), Undoped Silicate Glass (USG), or the like.

Figure 11B:
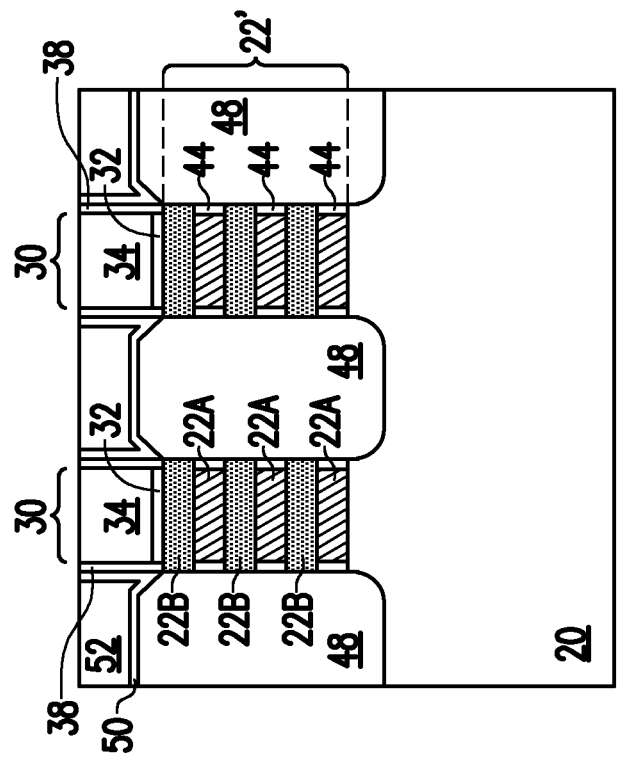
Figure 11A:
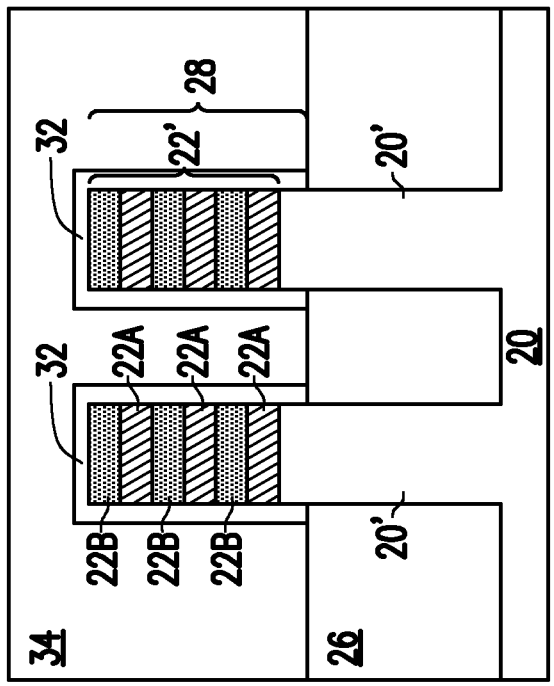

FIGS. 11A and 11B through FIGS. 14A and 14B illustrate the process for forming replacement gate stacks. In FIGS. 11A and 11B, a planarization process such as a CMP process or a mechanical grinding process is performed to level the top surface of the ILD 52. In accordance with some embodiments, the planarization process may remove the hard masks 36 to reveal the dummy gate electrodes 34, as shown in FIG. 11A. In accordance with alternative embodiments, the planarization process may reveal, and is stopped on, the hard masks 36. In accordance with some embodiments, after the planarization process, the top surfaces of the dummy gate electrodes 34 (or the hard masks 36), the gate spacers 38, and the ILD 52 are level within process variations.

Figure 12B:
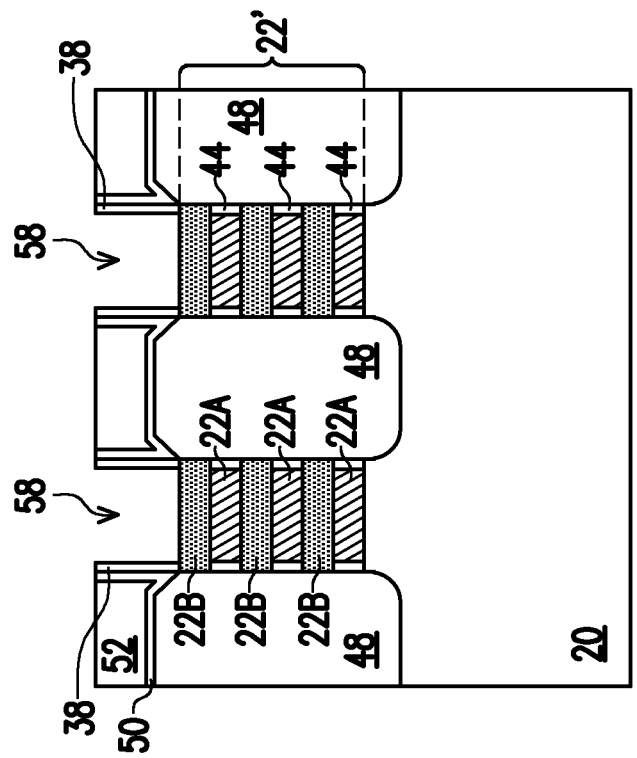
Figure 12A:
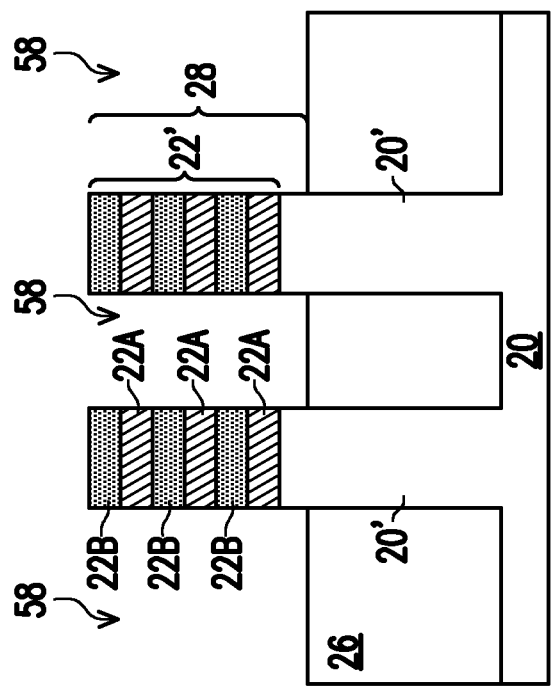

Next, the dummy gate electrodes 34 (and the hard masks 36, if remaining) are removed in one or more etching processes, so that recesses 58 are formed, as shown in FIGS. 12A and 12B. The portions of the dummy gate dielectrics 32 in the recesses 58 are also removed. In accordance with some embodiments, the dummy gate electrodes 34 and the dummy gate dielectrics 32 are removed through an anisotropic dry etch process. For example, the etching process may be performed using reaction gas(es) that selectively etch the dummy gate electrodes 34 at a faster rate than the ILD 52. Each of the recess 58 exposes and/or overlies portions of the multilayer stacks 22', which include the future channel regions in subsequently completed nanoFETs. The portions of the multilayer stacks 22' are between neighboring pairs of the epitaxial source/drain regions 48.

The sacrificial layers 22A are then removed to extend the recesses 58 between the nanostructures 22B, and the resulting structure is shown in FIGS. 13A and 13B. The sacrificial layers 22A may be removed by performing an isotropic etching process such as a wet etching process using etchants which are selective to the materials of the sacrificial layers 22A, while the nanostructures 22B, the substrate 20, the STI regions 26 remain relatively un-etched as compared to the sacrificial layers 22A. In accordance with some embodiments in which the sacrificial layers 22A include, for example, SiGe, and the nanostructures 22B include, for example, Si or SiC, tetra methyl ammonium hydroxide (TMAH), ammonium hydroxide (NH$_4$OH), or the like may be used to remove the sacrificial layers 22A.

Figures 14A, 14B:
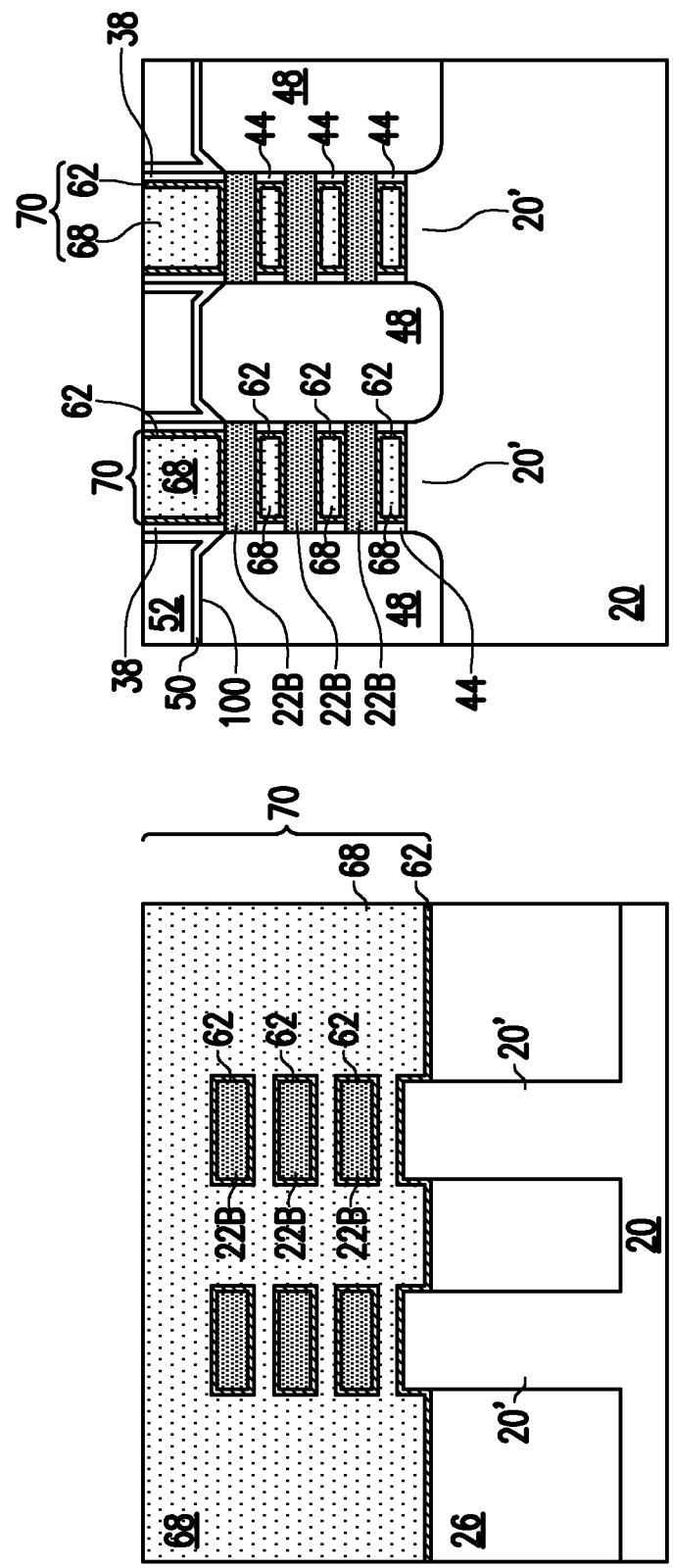

Referring to FIGS. 14A and 14B, gate dielectrics 62 are formed. In accordance with some embodiments, each of the gate dielectric 62 includes an interfacial layer and a high-k dielectric layer on the interfacial layer. The interfacial layer may be formed of or comprises silicon oxide, which may be deposited through a conformal deposition process such as ALD or CVD. In accordance with some embodiments, the high-k dielectric layers comprise one or more dielectric layers. For example, the high-k dielectric layer(s) may include a metal oxide or a silicate of hafnium, aluminum, zirconium, lanthanum, manganese, barium, titanium, lead, and combinations thereof.

Gate electrodes 68 are then formed. In the formation, conductive layers are first formed on the high-k dielectric layer and filling the remaining portions of the recesses 58. The gate electrodes 68 may include a metal-containing material such as TiN, TaN, TiAl, TiAlC, cobalt, ruthenium, aluminum, tungsten, combinations thereof, and/or multilayers thereof. For example, although in FIGS. 14A and 14B, a single layer is illustrated to represent the gate electrode 68, the gate electrode 68 may comprise any number of layers including any number of capping/adhesion layers, work function layers, and possibly a filling material. The gate dielectrics 62 and the gate electrode 68 also fill the spaces between adjacent ones of the nanostructures 22B, and fill the spaces between the bottom ones of the nanostructures 22B and the underlying substrate strips 20'. After the filling of the recesses 58, a planarization process such as a CMP process or a mechanical grinding process is performed to remove the excess portions of the gate dielectrics and the material of the gate electrodes 68, which excess portions are over the top surface of the ILD 52. The gate electrodes 68 and the gate dielectrics 62 are collectively referred to as gate stacks 70 of the resulting nano-FETs.

Figures 15A, 15B:
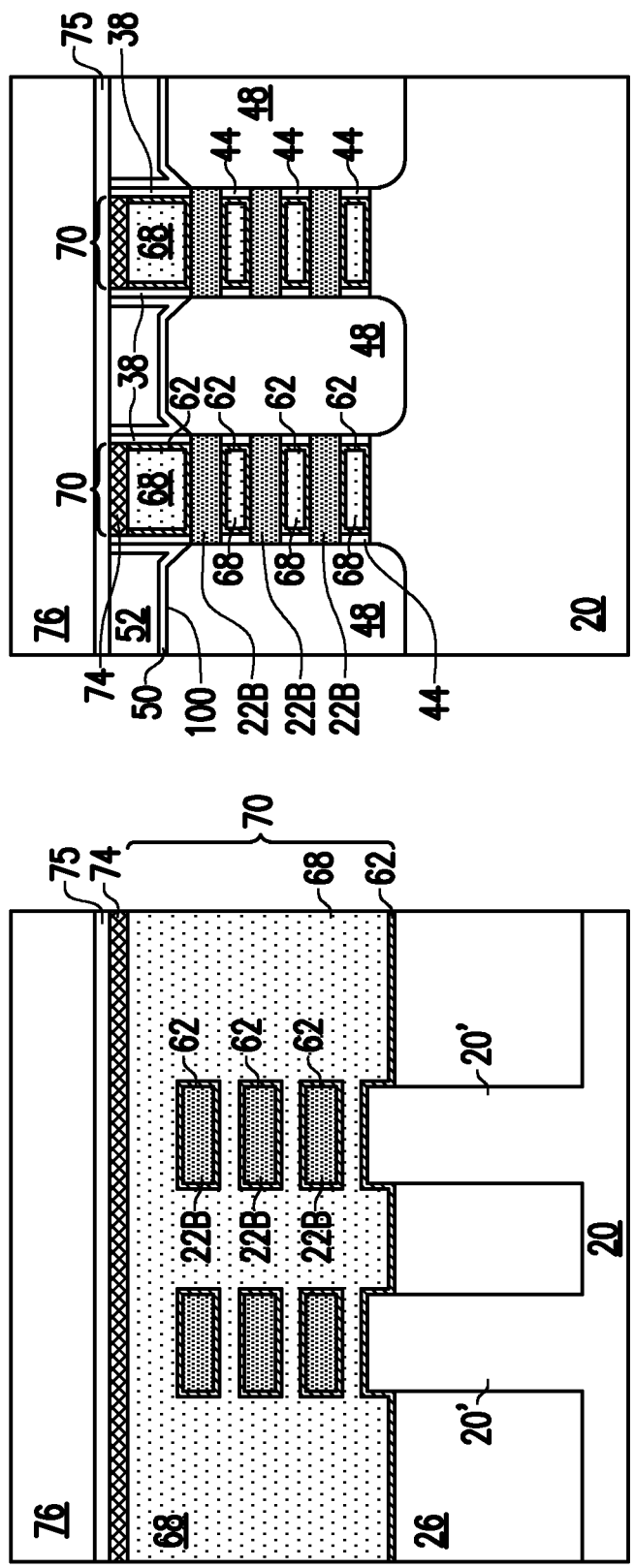

In the processes shown in FIGS. 15A and 15B, the gate stacks 70 are recessed, so that recesses are formed directly over the gate stacks 70 and between opposing portions of the gate spacers 38. A gate mask 74 comprising one or more layers of dielectric material, such as silicon nitride, silicon oxynitride, or the like, is filled in each of the recesses, followed by a planarization process to remove excess portions of the dielectric material extending over the ILD 52.

As further illustrated by FIGS. 15A and 15B, an etch stop layer 75 and an ILD 76 are deposited over the ILD 52 and over the gate masks 74. In accordance with some embodiments, the etch stop layer 75 is formed through ALD, CVD, PECVD, or the like, and may be formed of silicon nitride, silicon carbide, silicon oxynitride, aluminum oxide, aluminum nitride, or the like, or multilayers thereof. The ILD 76 is formed through FCVD, CVD, PECVD, or the like. The ILD 76 is formed of a dielectric material, which may be selected from silicon oxide, PSG, BSG, BPSG, USG, or the like.

FIGS. 16-31 illustrate the perspective views of intermediate stages in the formation of power vias of gate-all-around (GAA) transistors in accordance with some embodiments.

Figure 16:
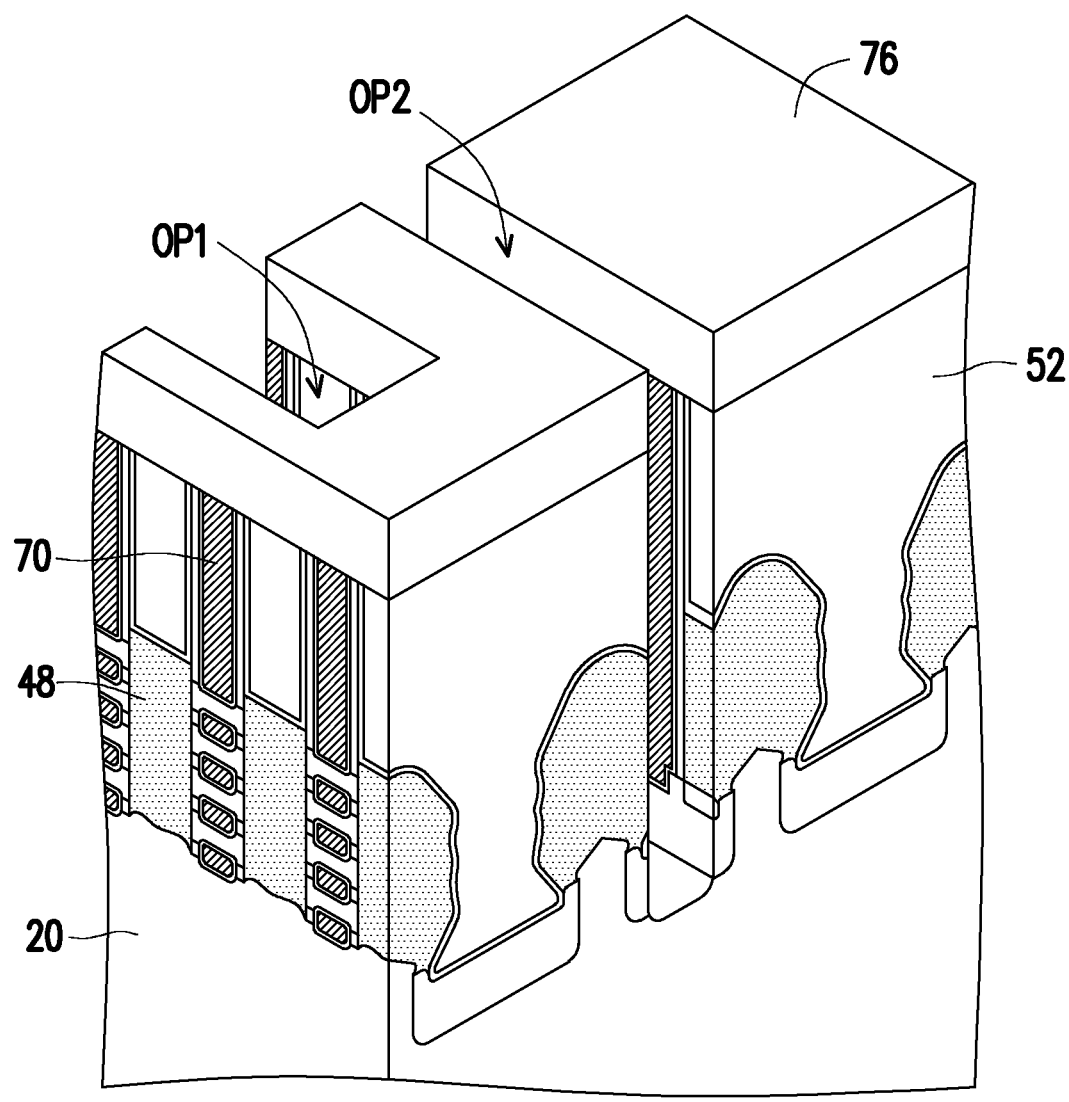
FIGS. 16-31 illustrate the perspective views of intermediate stages in the formation of power vias of gate-all-around (GAA) transistors in accordance with some embodiments.

Referring to FIG. 16, after forming the ILD 76, a first gate cutting process (i.e., a first CMG process) is performed to form first openings (or trenches) OP1 and OP2 in at least one dielectric layer deposited over the semiconductor substrate 20. In some embodiment, the first openings OP1 and OP2 may be formed in the ILD 52 and the ILD 76 after performing the first gate cutting process. During the first gate cutting process, not only portions of the ILD 52 and the ILD 76 are removed, but also first portions of gates 70 located corresponding to the first openings OP1 and OP2 are removed. As illustrated in FIG. 16, in some embodiments, the first opening OP1 is formed on cell boundary regions of the GAA transistors, and the first opening OP2 is formed on in-cell regions of the GAA transistors. The first opening OP1 merely occupies portion area of the cell boundary regions of the GAA transistors. The distribution area of the first opening OP1 may be smaller than that of the first opening OP2. The width of the first openings OP1 and OP2 may range from about 5 nanometers to about 50 nanometers, and the length of the first openings OP1 and OP2 may be greater than about 50 nanometers. The number and dimension of the first openings OP1 and OP2 are not limited in embodiments of the present invention.

In some embodiments, the first openings OP1 and OP2 are simultaneously formed in the ILD 52 and the ILD 76 through a photolithography and etch process. The height (i.e., etch depth) of the first openings OP1 and OP2 may be slightly greater than the sum of thicknesses of the ILD 52 and the ILD 76. In other words, when performing the first gate cutting process, the ILD 52 and the ILD 76 may be over-etched slightly until portions of the semiconductor substrate 20 are revealed by the first openings OP1 and OP2.

Figure 17:
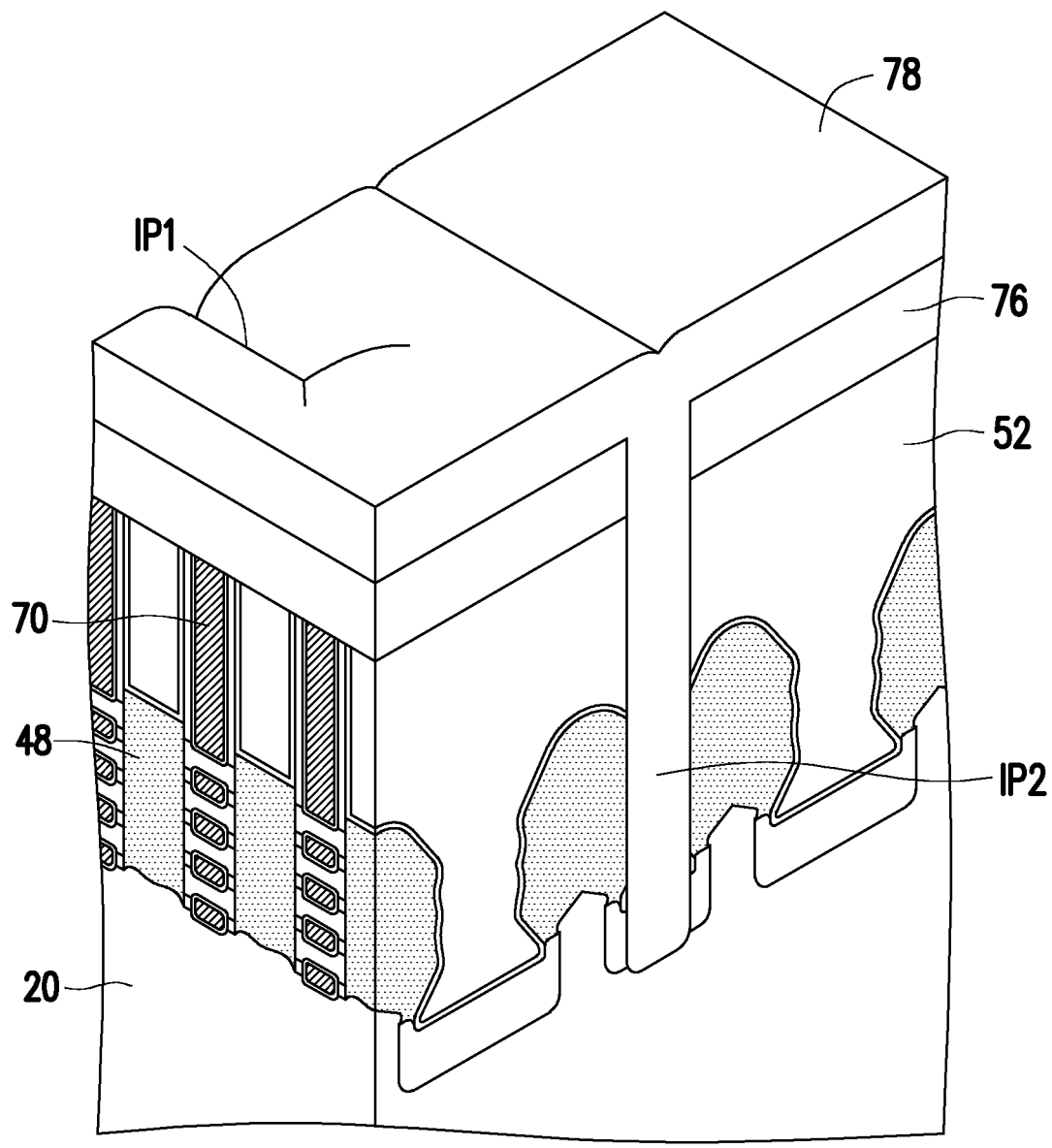

Referring to FIG. 16 and FIG. 17, an insulating material 78 is formed over the ILD 76 and fills the first openings OP1 and OP2. The insulating material 78 is formed through CVD or the like. The insulating material 78 is formed of a dielectric material, which may be selected from SiN, SiO, SiOC, AlO, AlON, ZrO, HfO, TiO, ZrAlO, ZnO, SiOCN, SiOCN, SiCN or the like. After depositing the insulating material 78, portions of the insulating material 78 which respectively fill the first openings OP1 and OP2 may be considered as a first insulator post IP1 and a second insulator post IP2.

Figure 18:
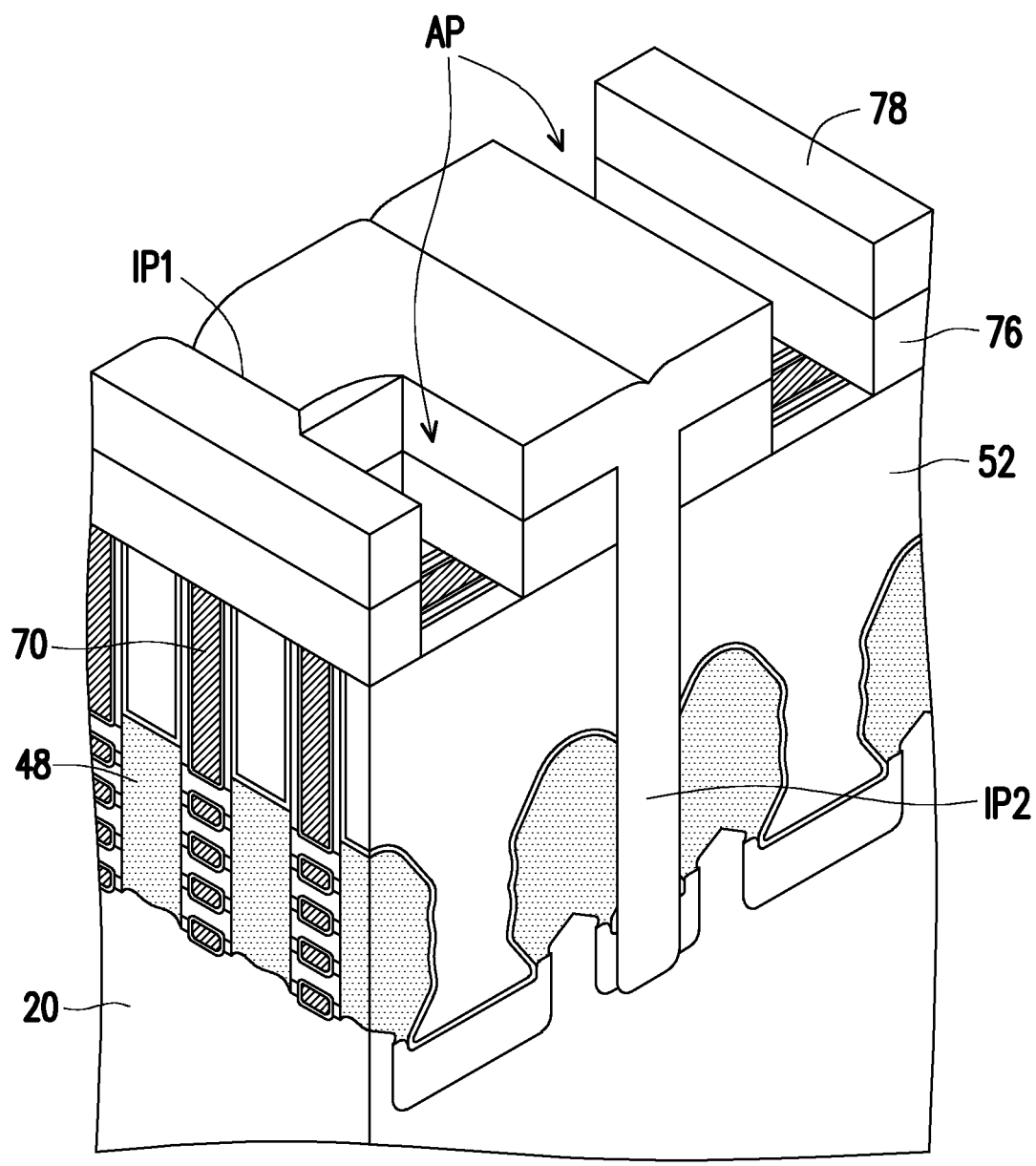

Referring to FIG. 18, after depositing the insulating material 78, the insulating material 78 and the ILD 76 are patterned through a photolithography and etch process. After the insulating material 78 and the ILD 76 are patterned, a patterned hard mask including apertures AP is formed. It is noted that the distribution of the apertures AP are not overlapped with the distribution of the first openings OP1 and OP2 (shown in FIG. 16).

Figure 19:
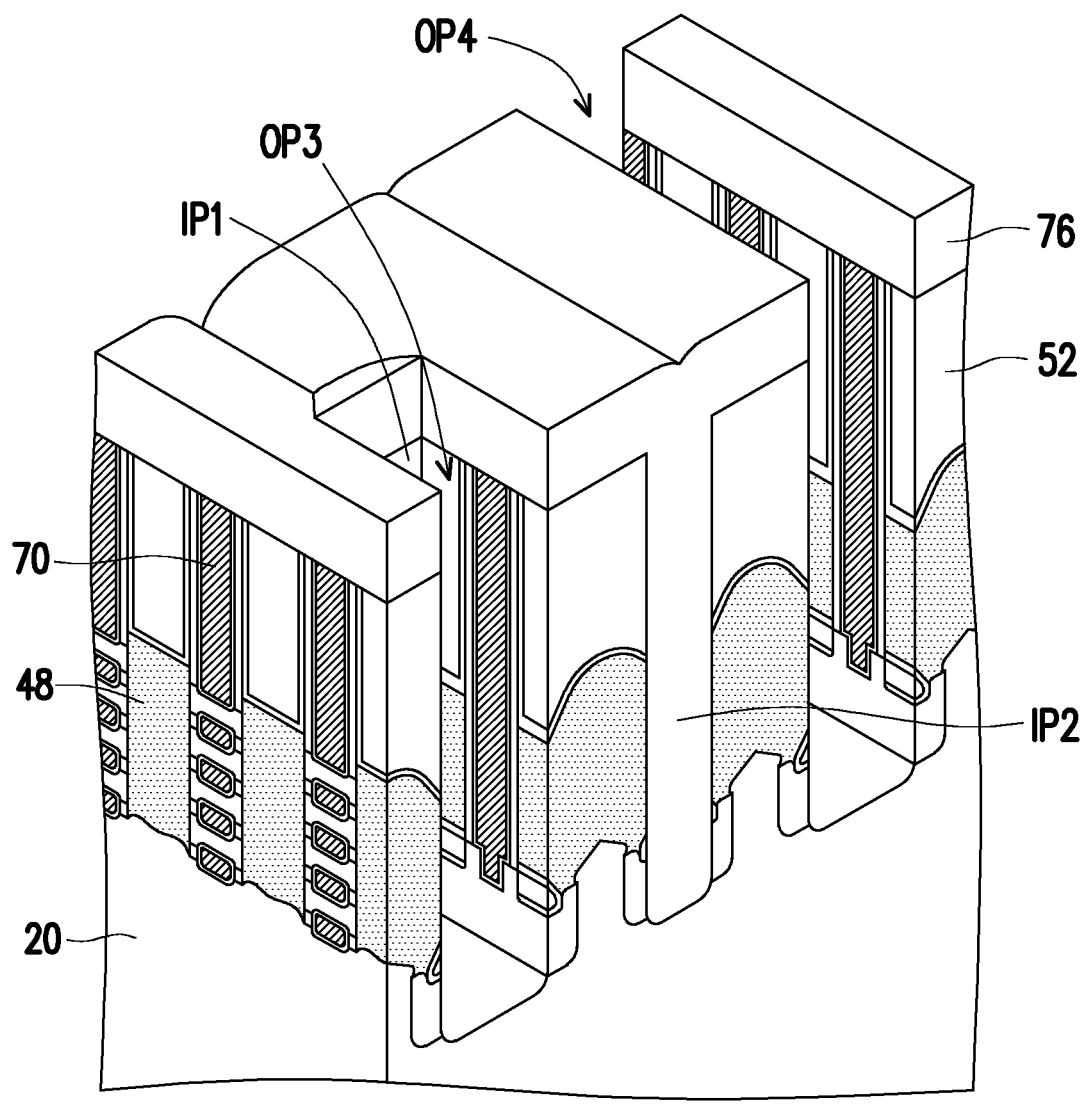

Referring to FIG. 19, by using the insulating material 78 and the ILD 76 (i.e., the patterned hard mask) as a mask, a second gate cutting process (i.e., a second CMG process) is performed to form second openings (or trenches) OP3 and OP4 in the ILD 76 and the insulating material 78. During the second gate cutting process, not only portions of the ILD 76 and the insulating material 78 are removed, but also second portions of gates 70 located corresponding to the second openings OP3 and OP4 are removed.

During the second gate cutting process, portions of the mask may be removed. In some embodiments, after performing the second gate cutting process, only an upper portion of the insulating material 78 is removed, and a lower portion of insulating material 78 remains on the ILD 76. In some other embodiments, after performing the second gate cutting process, the insulating material 78 is entirely removed from the ILD 76, and only the ILD 76 remains. In some alternative embodiments, after performing the second gate cutting process, the insulating material 78 and an upper portion of the ILD 76 are removed, and only a lower portion of the ILD 76 remains.

As illustrated in FIG. 19, in some embodiments, the second opening OP3 and OP4 are both formed on cell boundary regions of the GAA transistors. The second opening OP3 merely occupies portion area of the cell boundary regions of the GAA transistors. The distribution area of the second opening OP3 may be smaller than that of the second opening OP4. The width of the second openings OP3 and OP4 may range from about 5 nanometers to about 50 nanometers, and the length of the second openings OP3 and OP4 may be greater than about 50 nanometers. In some embodiments, the width of the first opening OP1 and OP2 illustrated in FIG. 16 is substantially equal to the width of the second openings OP3 and OP4 illustrated in FIG. 19. The number and dimension of the second openings OP3 and OP4 are not limited in embodiments of the present invention.

In some embodiments, the second openings OP3 and OP4 are simultaneously formed in the ILD 76 and the insulating material 78 through a photolithography and etch process. The height (i.e., etch depth) of the second openings OP3 and OP4 may be slightly greater than the sum of thicknesses of the ILD 76 and the insulating material 78. In other words, when performing the second gate cutting process, the insulating material 78 and the ILD 76 may be over-etched slightly until portions of the semiconductor substrate 20 are revealed by the second openings OP3 and OP4. In some embodiments, after forming the second openings OP3 and OP4, the sidewall of the first insulator post IP1 is revealed by the second opening OP3.

Figure 20:
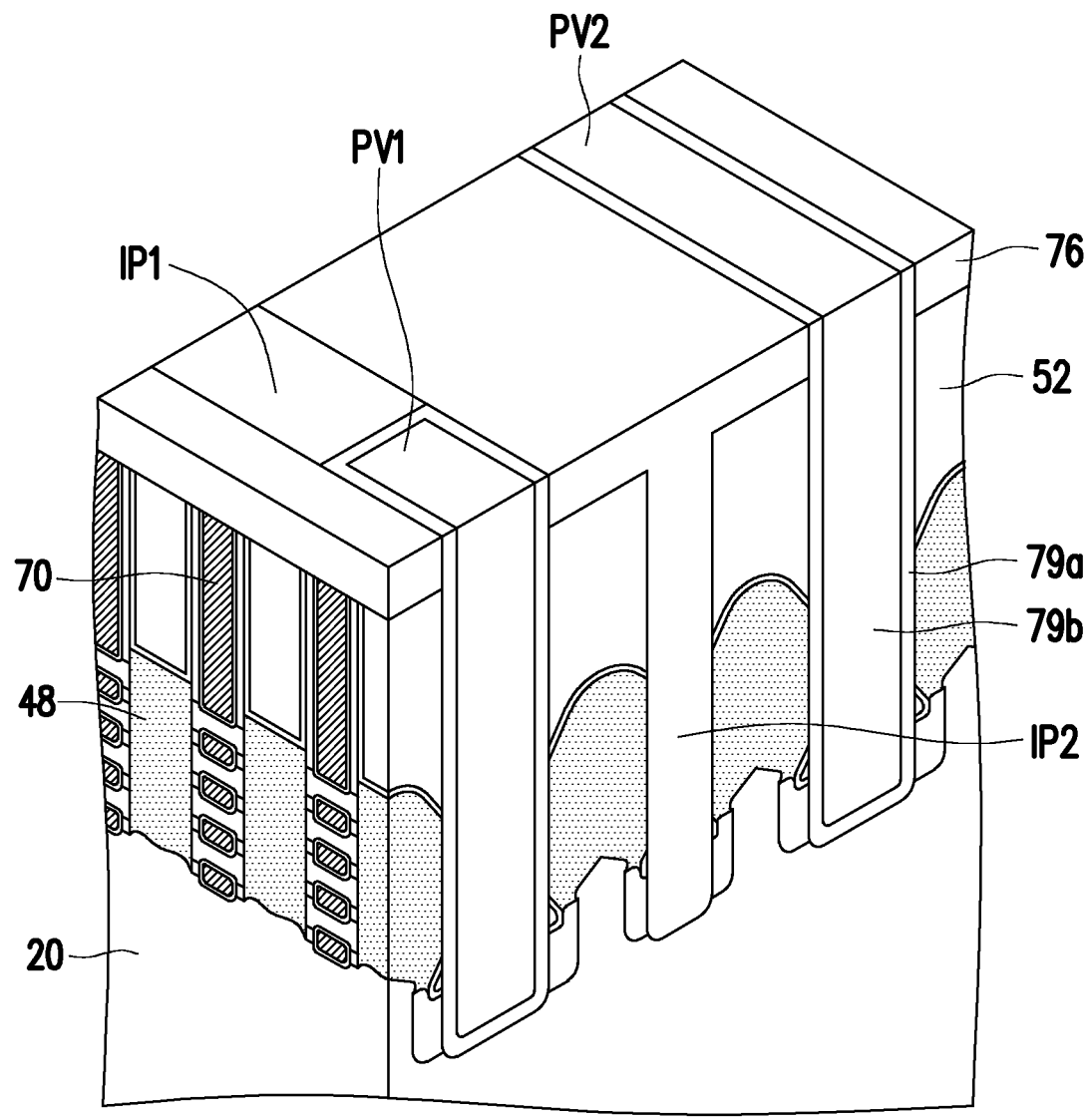

Referring to FIG. 19 and FIG. 20, after forming the second openings OP3 and OP4, power vias PV1 and PV2 are formed in the second openings OP3 and OP4. The power vias PV1 and PV2 are embedded in the ILD 76 and the ILD 52. Each of the power vias PV1 and PV2 formed in the second openings OP3 and OP4 may include a dielectric liner 79a and a conductive post 79b on the dielectric liner 79a, wherein the conductive posts 79b are wrapped by the dielectric liners 79a, and the conductive posts 79b are electrically insulated from the gates 70 by the dielectric liners 79a. A dielectric material is conformally deposited over the patterned hard mask. The thickness of the dielectric material may range from about 0.5 nanometer to about 10 nanometers. The material of the dielectric material may include SiN, SiO, SiOC, AlO, AlON, ZrO, HfO, TiO, ZrAlO, ZnO, SiOCN, SiOCN, SiCN or the like. A conductive material is then deposited over the dielectric material, wherein the conductive material fills the second opening OP3 and OP4. The conductive material may be formed by depositing a glue layer (i.e., seed layer) and depositing a conductive layer over the glue layer. The glue layer may be formed through a sputtering process, and the conductive layer may be formed through a plating process. The glue layer may be TiN, TaN or the like. The conductive layer may be Co, W, Mo, Ru or the like. In some other embodiments, the glue layer may be omitted.

After forming the conductive material, a first removal process is performed to partially remove the conductive material located outside the second openings OP3 and OP4 such that the top surface of the ILD 76 substantially levels with the top surface of the insulator posts IP1 and IP2 as well as the top surfaces of the power vias PV1 and PV2. The first removal process may be or include a planarization process such as a CMP process or a mechanical grinding process.

Figure 21:
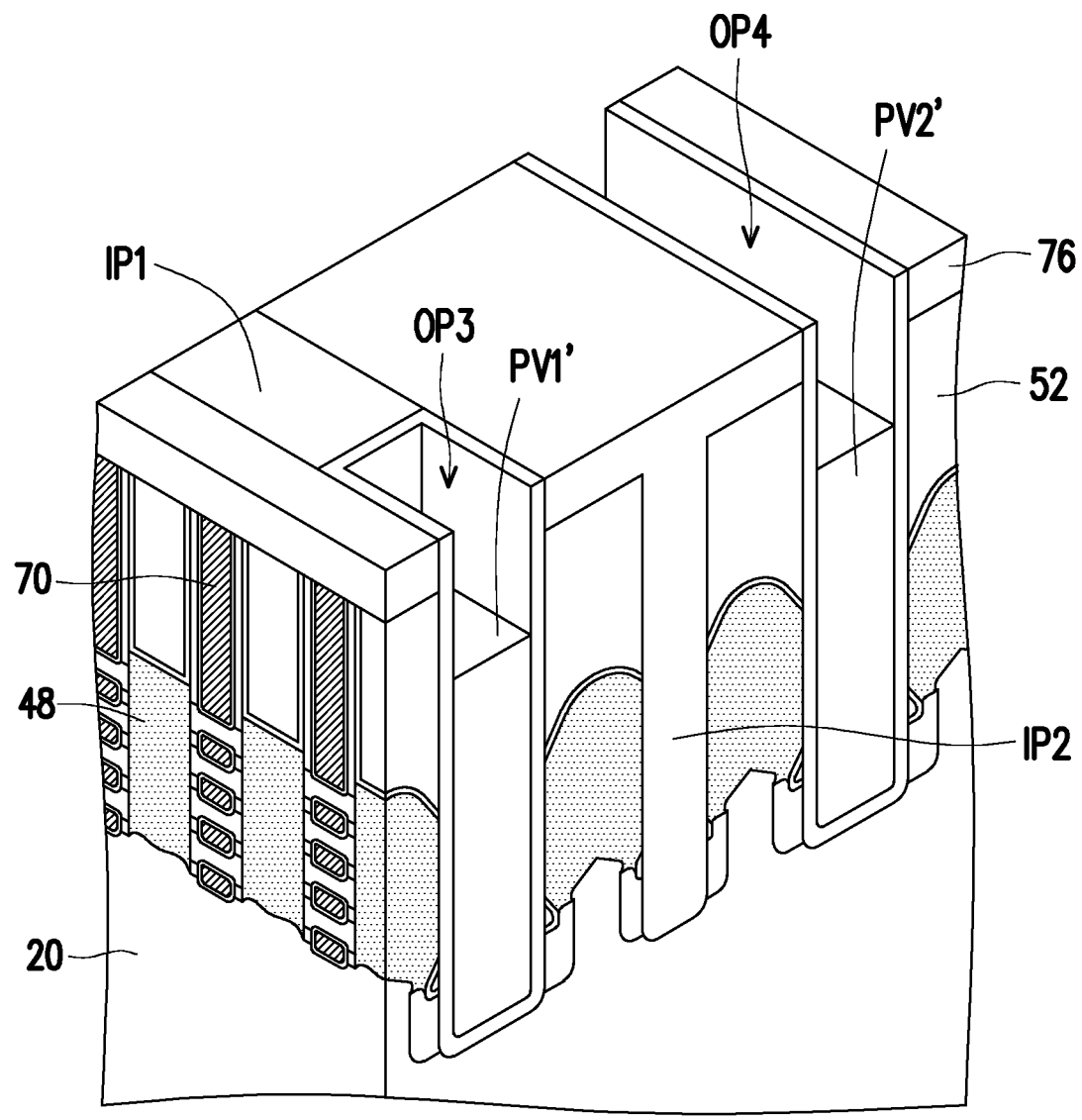

Referring to FIG. 21, after performing the first removal process, a second removal process is performed to partially remove the conductive posts 79b of the power vias PV1 and PV2 until the top surfaces of the conductive posts 79b are lower than an upper edge of the second openings OP3 and OP4. In some embodiments, the second removal process includes an etch process. After performing the second removal process, power vias PV1' and PV2' with reduced height are formed. The second removal process may selectively and partially remove the conductive material of the conductive posts 79b such that conductive posts 79b' are formed and upper portions of the dielectric liner 79a are revealed.

As illustrated in FIG. 21, the conductive posts 79b are spaced apart from the gates 70 as well as the epitaxial source/drain regions 48 by the dielectric liner 79a. Furthermore, the conductive posts 79b are electrically insulated from the gates 70, and the conductive posts 79b are not electrically connected to the epitaxial source/drain regions 48 directly. The conductive posts 79b may be electrically connected to the epitaxial source/drain regions 48 through subsequently formed wirings in an interconnect structure.

In the present embodiment, a two-step gate cutting process is performed to form the insulator posts IP1 and IP2 as well as the power vias PV1' and PV2' at the cell boundary regions of the GAA transistors such that the formation of the power vias PV1' and PV2' can be integrated into the cut metal gate (CMG) process for patterning the gates 70 of GAA transistors. Since the fabrication process of the power vias PV1' and PV2' and the cut metal gate (CMG) process for patterning the gates 70 are integrated, the gates 70 are not damaged when fabricating the power vias PV1' and PV2'. Accordingly, the fabricating process of the power vias PV1' and PV2' may be simplified.

Referring to FIGS. 22-26, after forming the power vias PV1' and PV2', a continuous poly on oxide definition edge (CPODE) pattern is formed over the substrate 20. In some embodiments, the process for forming the CPODE pattern is omitted.

Figure 22:
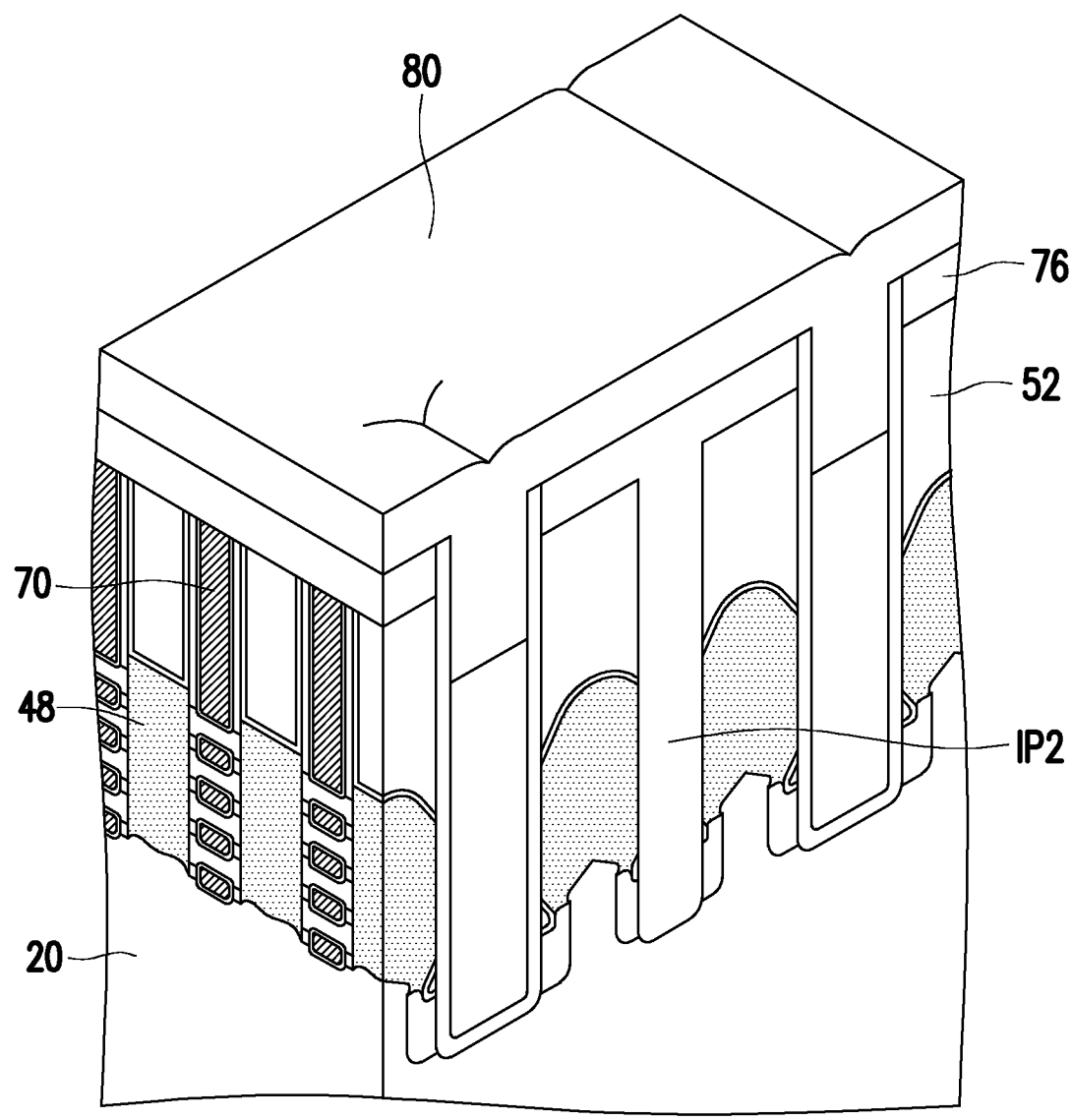

Referring to FIG. 21 and FIG. 22, a hard mask 80 is deposited over the ILD 76, the insulator posts IP1 and IP2 as well as the power vias PV1' and PV2'. The hard mask 80 fills the upper portions of the second openings OP3 and OP4 which are not occupied by the power vias PV1' and PV2'. The hard mask 80 may be formed through CVD or the like. The material of the hard mask 80 may include SiN, SiO, SiOC, AlO, AlON, ZrO, HfO, TiO, ZrAlO, ZnO, SiOCN, SiOCN, SiCN or the like.

Figure 23:
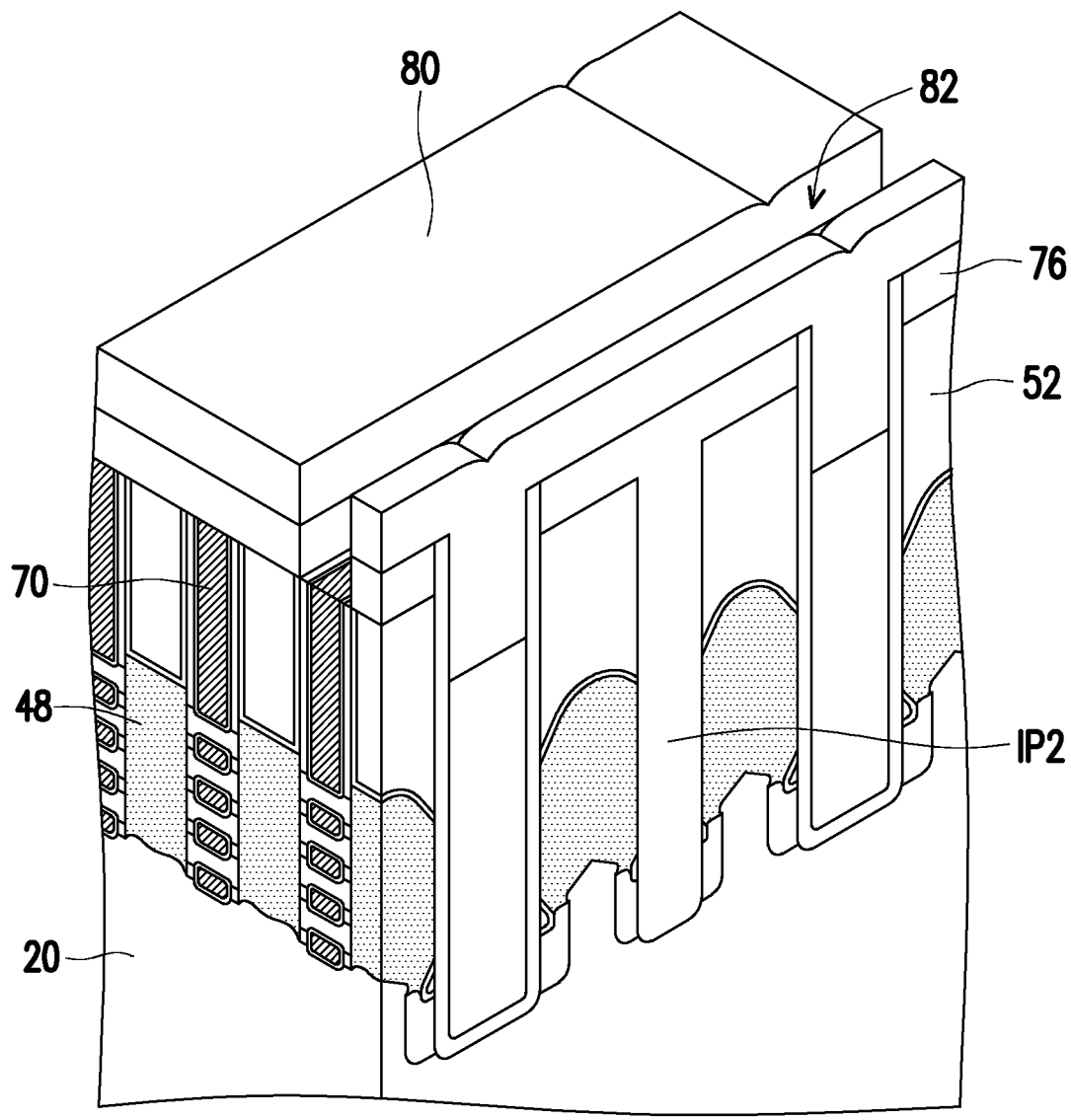
Figure 24:
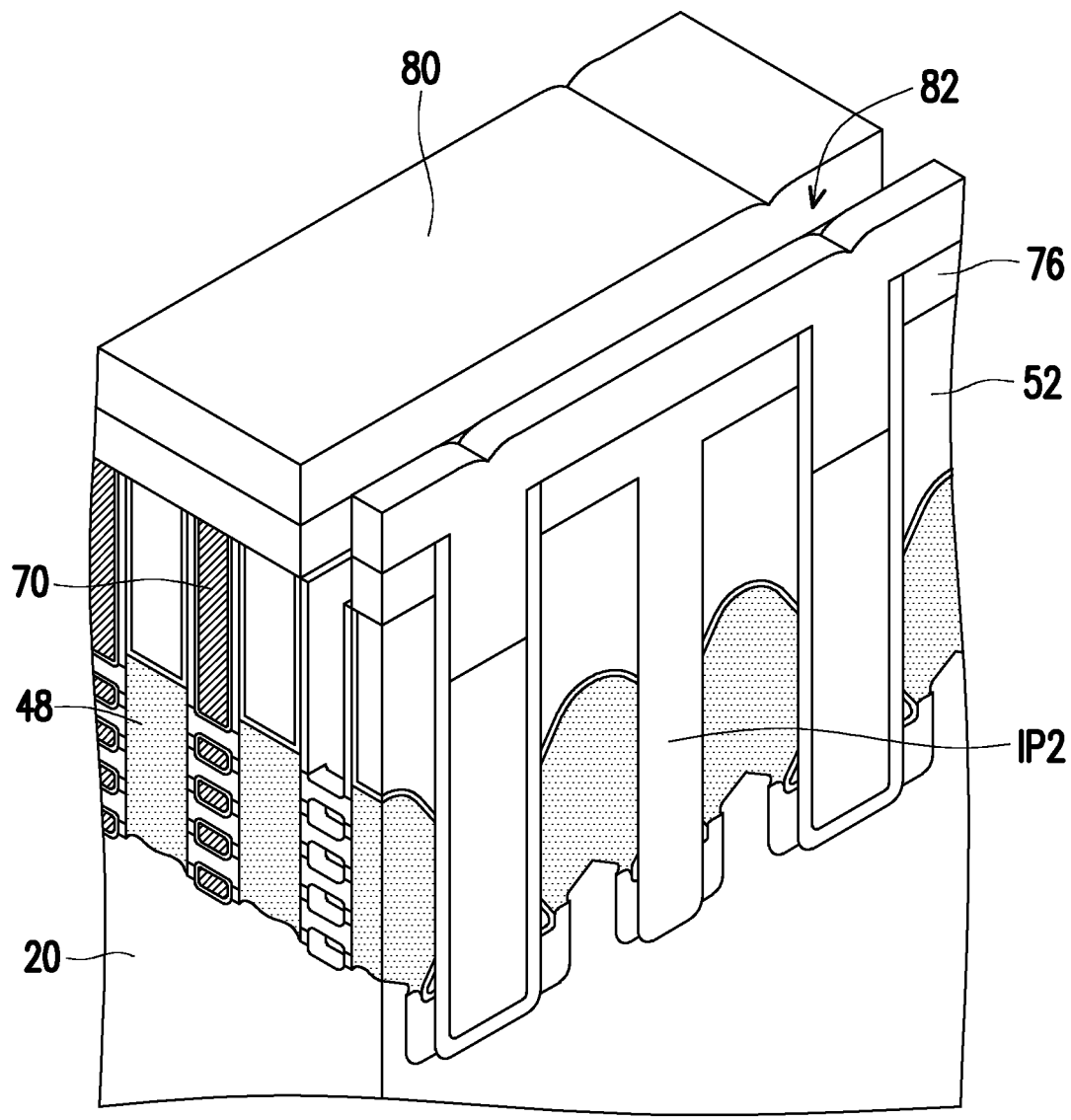
Figure 25:
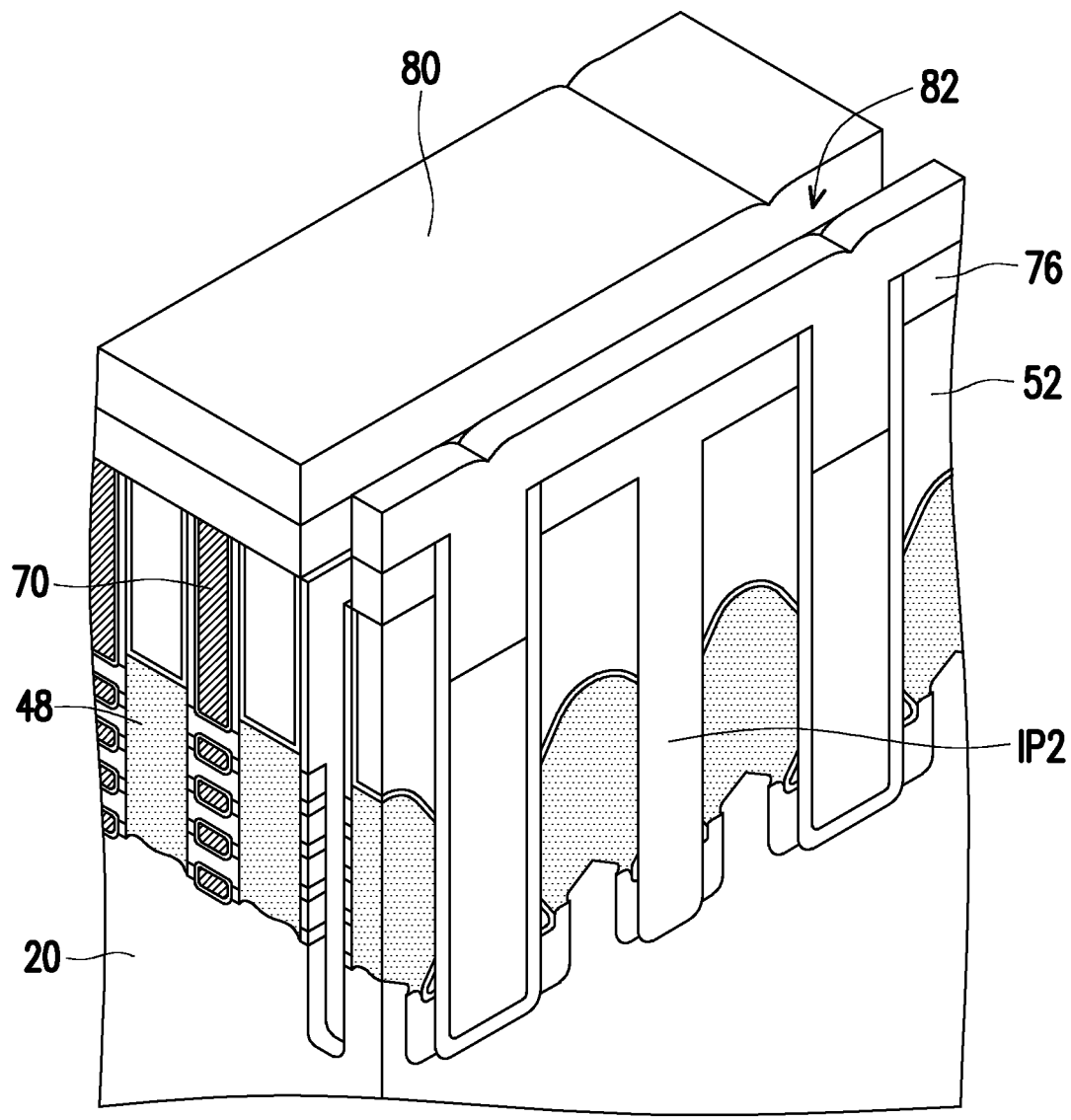

Referring to FIGS. 23-25, the hard mask 80 is patterned, and a trench 82 is formed in the hard mask 80. The trench 82 may be formed in the hard mask 80 through a photolithography and etch process. Portions (i.e., third portions or dummy portions) of the gates 70 which are located under the trench 82 may be removed through an etch process, as illustrated in FIG. 24. Then, semiconductor channel portions which are located under the trench 82 may be removed through an etch process, as illustrated in FIG. 25. In some embodiments, when removing the semiconductor channel portions, portions of the semiconductor substrate 20 which are located under the trench 82 may be removed as well, as illustrated in FIG. 25.

Figure 26:
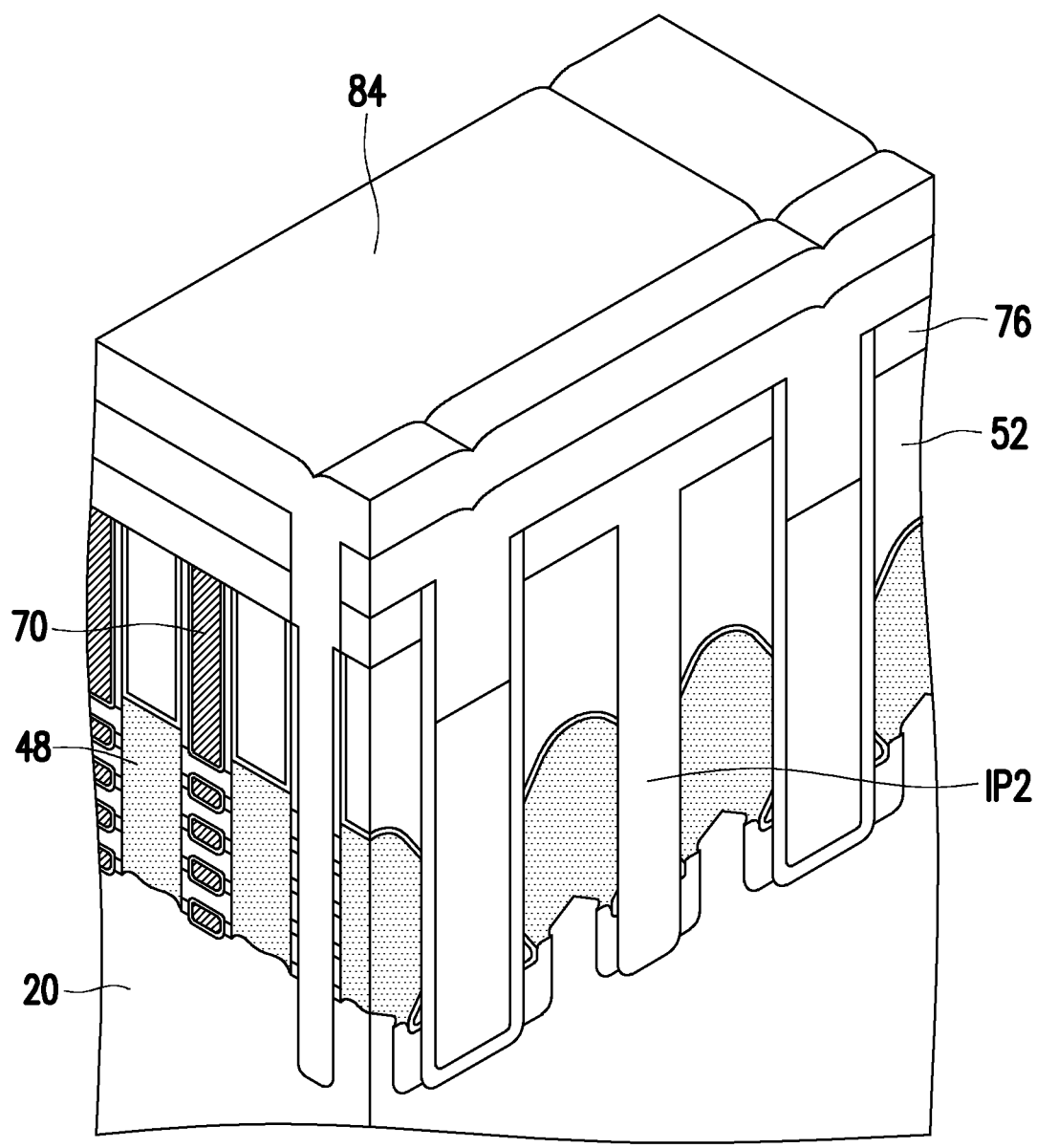

Referring to FIG. 25 and FIG. 26, an insulating material 84 is formed over the hard mask 80 and fills the trench 82. The insulating material 84 is formed through CVD or the like. The insulating material 84 is formed of a dielectric material, which may be selected from SiN, SiO, SiOC, AlO, AlON, ZrO, HfO, TiO, ZrAlO, ZnO, SiOCN, SiOCN, SiCN or the like. After depositing the insulating material 84, portions of the insulating material 84 which respectively fill the trench 82 may be considered as a third insulator post IP3.

Figure 27:
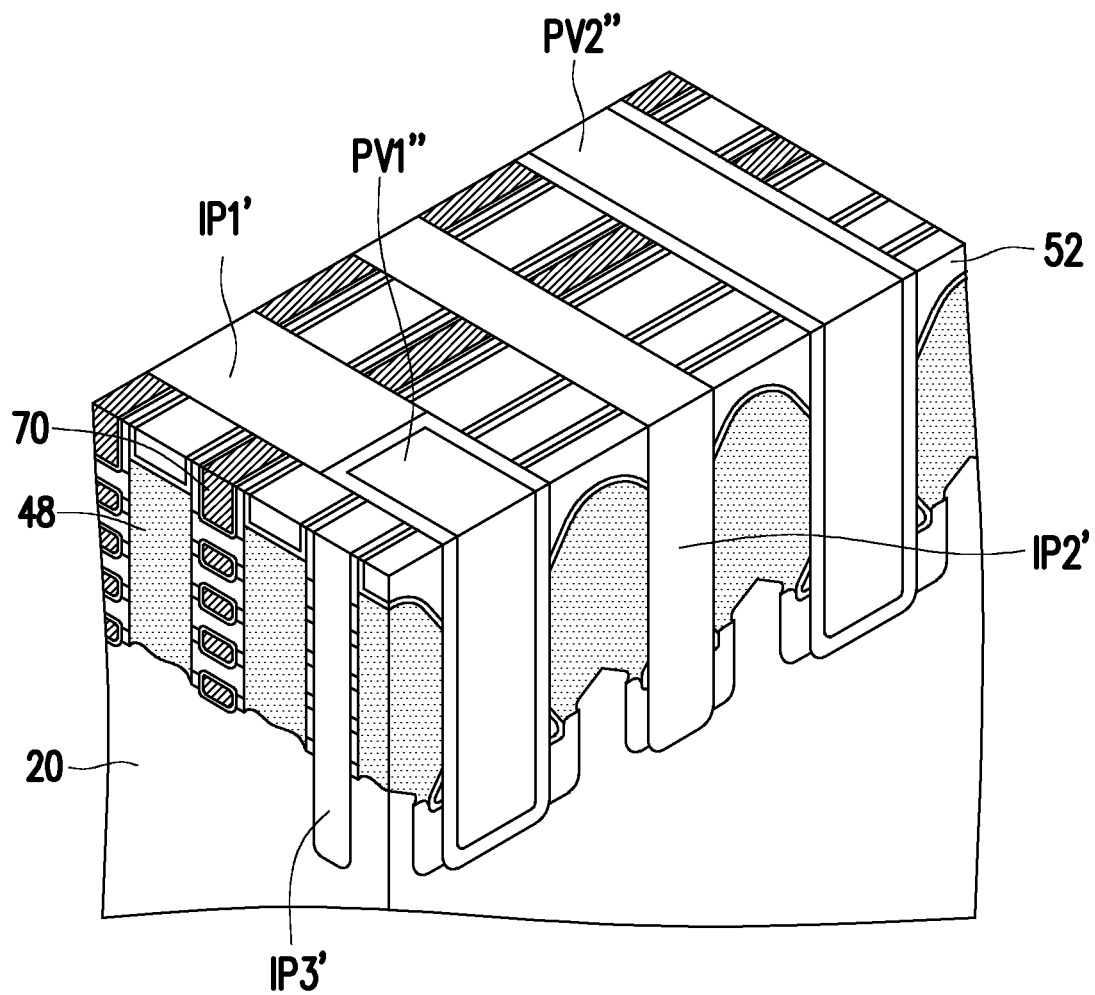

Referring to FIG. 26 and FIG. 27, after forming the insulating material 84, a removal process is performed to remove portions of the insulating material 84, the hard mask 80, the ILD 76, portions of the gates 70, portions of the ILD 52, portions of the insulator posts IP1, IP2, IP3 as well as portions of the power vias PV1' and PV2'. The removal process may be or include a planarization process such as a CMP process or a mechanical grinding process. After performing the removal process, gates 70', an ILD 52', insulator posts IP1', IP2', IP3' as well as power vias PV1" and PV2" are formed. The top surfaces of the gates 70', the ILD 52', the insulator posts IP1', IP2', IP3' as well as the power vias PV1" and PV2" are substantially coplanar. In some embodiments, the height of the power vias PV1" and PV2" range from about 30 nanometers to about 150 nanometers.

As illustrated in FIG. 27, the insulator post IP3' may be considered as the CPODE pattern. After forming the CPODE pattern, a cell array of GAA transistors is essentially formed. Furthermore, the integration of insulator post IP1' and the power vias PV1" and PV2" may provide high integration density and good device performance.

Figure 28:
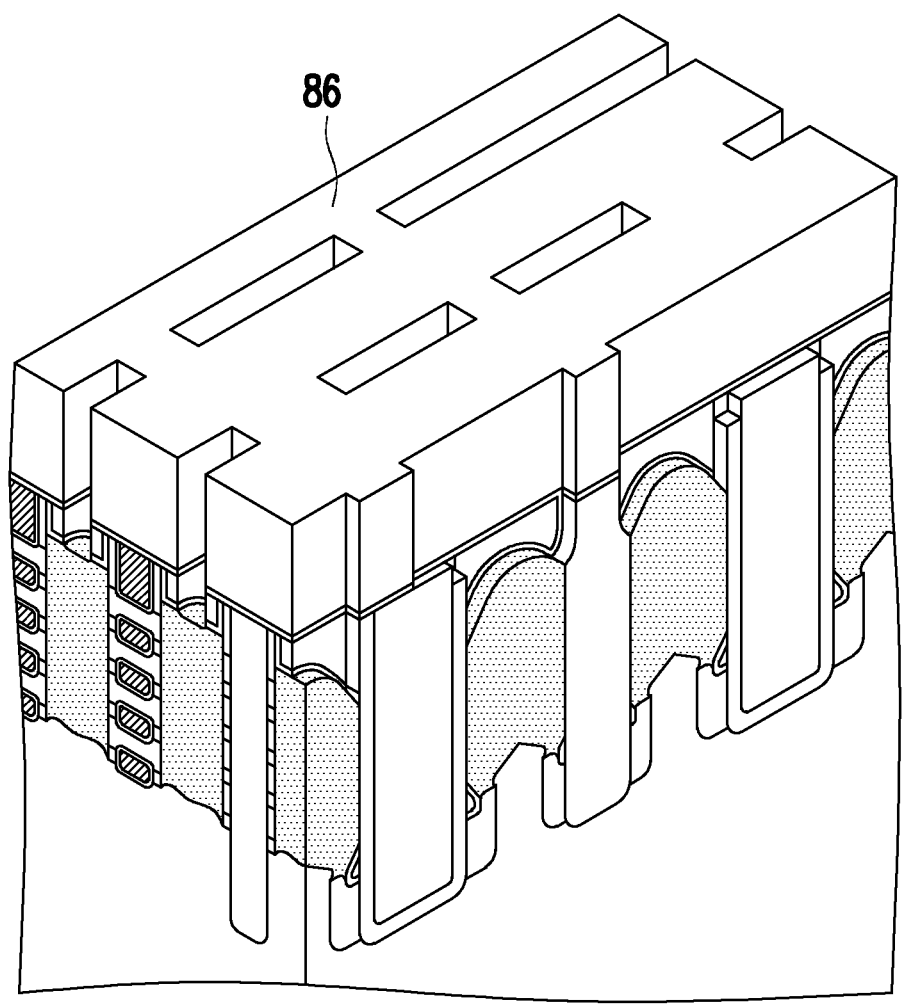
Figure 29:
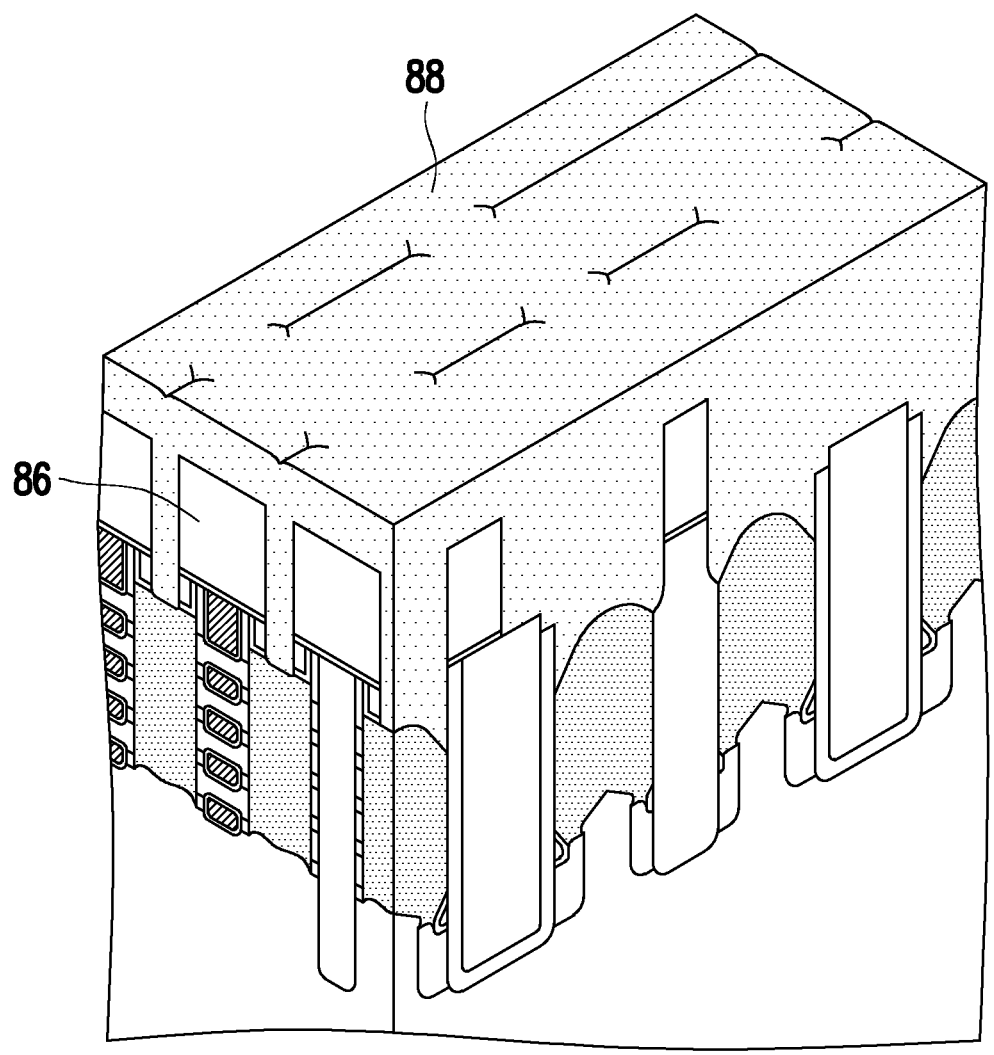

Referring to FIG. 28 and FIG. 29, a patterned ILD 86 and a conductive material 88 are formed over the resulted structure illustrated in FIG. 27. The patterned ILD 86 is formed through FCVD, CVD, PECVD, or the like. The patterned ILD 86 is formed of a dielectric material, which may be selected from silicon oxide, PSG, BSG, BPSG, USG, or the like. The patterned ILD 86 is patterned through a photolithography and etch process. The conductive material 88 may be formed by depositing a glue layer (i.e., seed layer) and depositing a conductive layer over the glue layer. The glue layer may be formed through a sputtering process, and the conductive layer may be formed through a plating process. The glue layer may be TiN, TaN or the like. The conductive layer may be Co, W, Mo, Ru or the like. In some other embodiments, the glue layer may be omitted. In some embodiments, the conductive material 88 is the same with the conductive posts 79b in the power vias PV1 and PV2 (shown in FIG. 20). In some other embodiments, the conductive material 88 is different from the conductive posts 79b in the power vias PV1 and PV2 (shown in FIG. 20).

Figure 30:
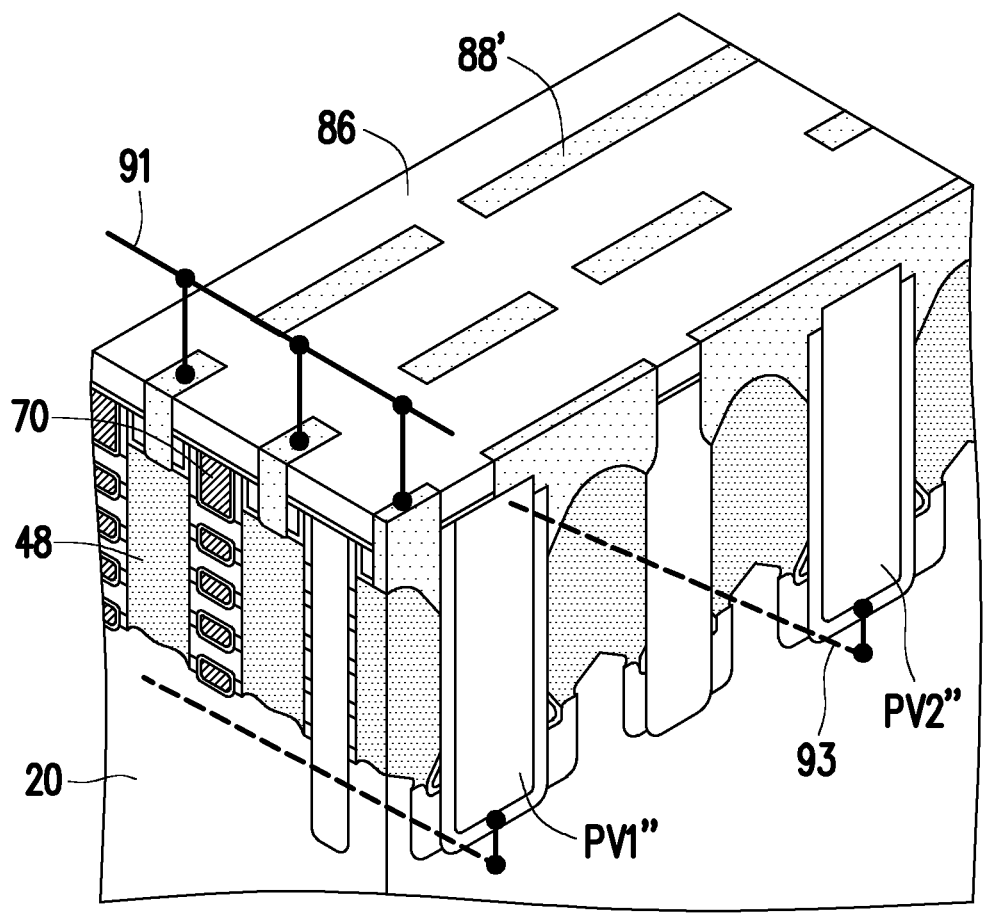

Referring to FIG. 29 and FIG. 30, a removal process is performed to remove portions of the conductive material 88 until the top surface of the patterned ILD 86 is revealed. The removal process may be or include a planarization process such as a CMP process or a mechanical grinding process. After performing the removal process of the conductive material 88, metal drains (i.e., metallic source/drain regions) 88' embedded in the patterned ILD 86 are formed. As illustrated in FIG. 30, portions of the metal drains 88' are electrically connected to the power vias PV1" and PV2".

Figure 31:
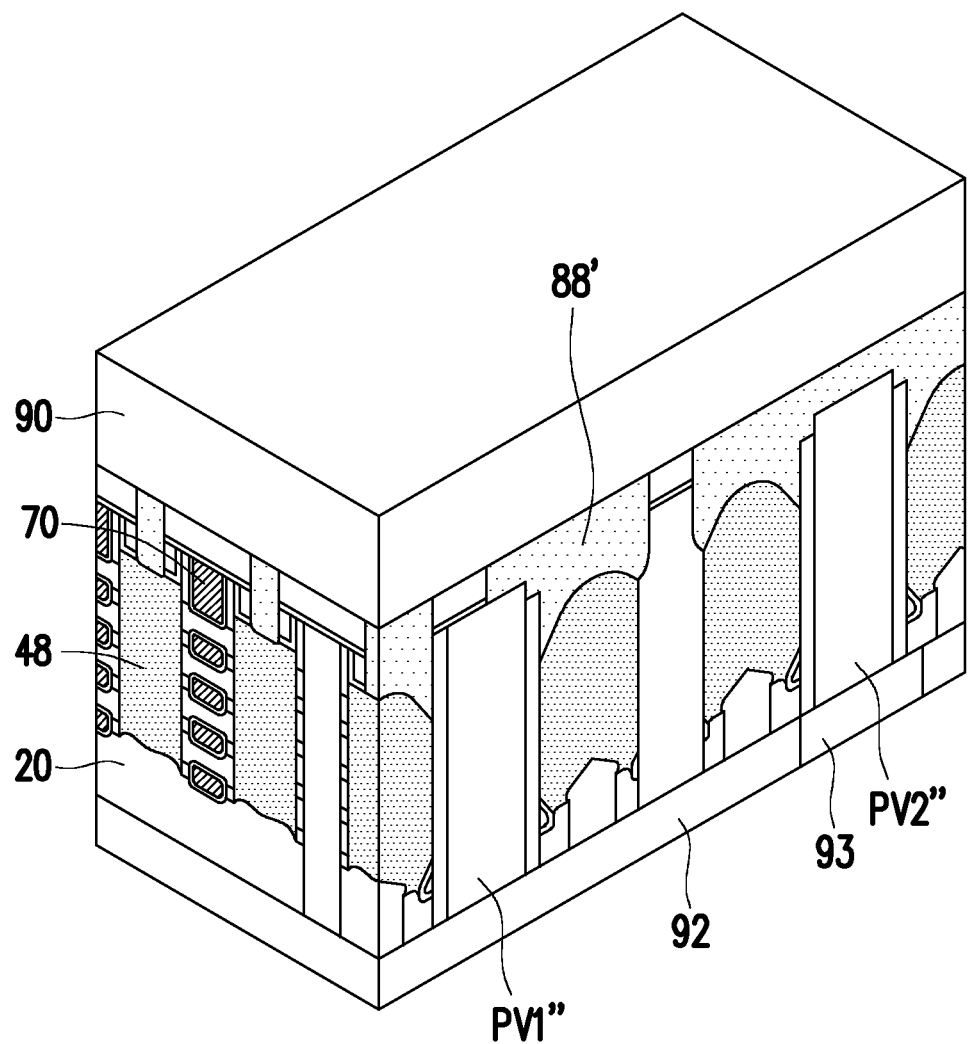

Referring to FIG. 30 and FIG. 31, after forming the metal drains 88', an interconnect structure 90 is formed over the patterned ILD 86 and the metal drains 88'. The interconnect structure 90 may be electrically connected interconnect wirings embedded in ILDs, wherein the interconnect wirings in the interconnect structure 90 may include signal wirings and front-side power rails 91, and the front-side power rails 91 are electrically connected to the power vias PV1" and PV2" through portions of the metal drains 88'.

After forming the interconnect structure 90, a thinning process may be performed on the back surface of the semiconductor substrate 20 such that the thickness of the semiconductor substrate 20 is reduced.

After performing the thinning process of the semiconductor substrate 20, a backside passivation layer 92 and a conductor 93 penetrating through the backside passivation layer 92 are formed on the back surface of the semiconductor substrate 20. In some embodiments, the conductor 93 formed on the back surface of the semiconductor substrate 20 includes backside power rails and/or signal wirings.

Furthermore, the conductor 93 may be electrically connected to the bottom ends of the power vias PV1" and PV2".

The power vias illustrated in embodiments of the present application may electrically connect front-side metal routings (e.g., metal drain (MD)) and backside power for better device performance. For example, the power efficiency gain is about 3%, and the routing flexibility of front-side routings can be improved.

In accordance with some embodiments of the disclosure, a method for forming a semiconductor device including followings is provided. A transistor is formed, and the transistor is embedded in a dielectric layer and disposed over a semiconductor substrate. A first gate cutting process is performed to form a first opening in the dielectric layer. An insulator post is formed in the first opening. A second gate cutting process is performed to form a second opening in the dielectric layer. A power via is formed in the second opening. A conductor is formed, wherein the conductor is embedded in the semiconductor substrate, and the conductor is located under and electrically connected to the power via. In some embodiments, the first gate cutting process is performed prior to the second gate cutting process. In some embodiments, a sidewall of the insulator post is revealed by the second opening before forming the power via in the second opening. In some embodiments, forming the power via in the second opening includes forming a dielectric liner in the second opening; and forming a conductive post on the dielectric liner, wherein the conductive post fills the second opening, and the dielectric liner wraps the conductive post. In some embodiments, forming the conductive post includes: depositing a conductive material over the dielectric liner, wherein the conductive material fills the second opening; performing a first removal process to partially remove the conductive material located outside the second opening; and performing a second removal process to partially remove the conductive material located in the second opening until a top surface of the conductive material is lower than an upper edge of the second opening. In some embodiments, the first removal process includes a chemical mechanical polishing process, and the second removal process includes an etch process. In some embodiments, the method further includes thinning the semiconductor substrate, wherein the conductor is formed after thinning the semiconductor substrate.

In accordance with some other embodiments of the disclosure, a method for forming a semiconductor device including followings is provided. Transistors are formed, and the transistors are embedded in a dielectric layer. A first gate cutting process is performed to form first openings in the dielectric layer, wherein first portions of gates of the transistors are removed by the first gate cutting process. Insulator posts are formed in the first openings. A second gate cutting process is performed to form second openings in the dielectric layer, wherein second portions of the gates of the transistors are removed by the second gate cutting process. Dielectric liners are formed in the second openings. Conductive posts are formed on the dielectric liners, wherein the conductive posts fill the second openings, and the dielectric liners wrap the conductive posts such that the conductive posts are electrically insulated from the gates of the transistors. In some embodiments, the first gate cutting process is performed prior to the second gate cutting process. In some embodiments, sidewalls of the insulator posts are revealed by portions of the second openings before forming the dielectric liners and the conductive posts in the second openings. In some embodiments, forming the dielectric liners and forming the conductive posts includes: depositing a dielectric material over the dielectric layer; depositing a conductive material on the dielectric material, wherein the conductive material fills the second openings; performing a first removal process to partially remove the conductive material and the dielectric material located outside the second openings; and performing a second removal process to partially remove the conductive material located in the second openings until a top surface of the conductive material is lower than an upper edge of the second openings. In some embodiments, the first removal process includes a chemical mechanical polishing process, and the second removal process includes an etch process. In some embodiments, the method further includes forming at least one conductor electrically connected to bottom ends of the conductive posts. In some embodiments, the method further includes removing third portions of gates of the transistors after forming the conductive posts on the dielectric liners.

In accordance with some other embodiments of the disclosure, a method for forming a semiconductor device including followings is provided. Transistors are formed, and the transistors are embedded in a dielectric layer disposed on a first surface of a semiconductor substrate. A first gate cutting process is performed to form first openings in the dielectric layer. Insulator posts are formed in the first openings. A second gate cutting process is performed to form second openings in the dielectric layer. Power vias are formed in the second openings. An interconnect structure is formed over the transistors, the dielectric layer and the power vias. A thinning process is performed from a second surface of the semiconductor substrate, wherein the second surface is opposite to the first surface. A conductor is formed to penetrate through the semiconductor substrate, wherein the conductor is electrically connected to bottom ends of the power vias. In some embodiments, the first gate cutting process is performed prior to the second gate cutting process. In some embodiments, sidewalls of the insulator posts are revealed by portions of the second openings before forming the power vias. In some embodiments, forming the power vias includes: depositing a dielectric material over the dielectric layer; depositing a conductive material on the dielectric material, wherein the conductive material fills the second openings; performing a first removal process to partially remove the conductive material and the dielectric material located outside the second openings; and performing a second removal process to partially remove the conductive material located in the second openings until a top surface of the conductive material is lower than an upper edge of the second openings. In some embodiments, the first removal process comprises a chemical mechanical polishing process, and the second removal process comprises an etch process. In some embodiments, the method further comprising includes removing third portions of gates of the transistors after forming the power vias.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device, comprising:
    forming a transistor embedded in a dielectric layer and disposed over a semiconductor substrate;
    performing a first gate cutting process to form a first opening in the dielectric layer;
    forming an insulator post in the first opening;
    performing a second gate cutting process to form a second opening in the dielectric layer;
    forming a power via in the second opening; and
    forming a conductor embedded in the semiconductor substrate, wherein the conductor is located under and electrically connected to the power via.

2. The method as claimed in claim 1, wherein the first gate cutting process is performed prior to the second gate cutting process.

3. The method as claimed in claim 2, wherein a sidewall of the insulator post is revealed by the second opening before forming the power via in the second opening.

4. The method as claimed in claim 1, wherein forming the power via in the second opening comprises:
    forming a dielectric liner in the second opening; and
    forming a conductive post on the dielectric liner, wherein the conductive post fills the second opening, and the dielectric liner wraps the conductive post.

5. The method as claimed in claim 4, wherein forming the conductive post comprises:
    depositing a conductive material over the dielectric liner, wherein the conductive material fills the second opening;
    performing a first removal process to partially remove the conductive material located outside the second opening; and
    performing a second removal process to partially remove the conductive material located in the second opening until a top surface of the conductive material is lower than an upper edge of the second opening.

6. The method as claimed in claim 5, wherein the first removal process comprises a chemical mechanical polishing process, and the second removal process comprises an etch process.

7. The method as claimed in claim 1 further comprising:
    thinning the semiconductor substrate, wherein the conductor is formed after thinning the semiconductor substrate.

8. A method for forming a semiconductor device, comprising:
    forming transistors embedded in a dielectric layer;
    performing a first gate cutting process to form first openings in the dielectric layer, wherein first portions of gates of the transistors are removed by the first gate cutting process;
    forming insulator posts in the first openings;
    performing a second gate cutting process to form second openings in the dielectric layer, wherein second portions of the gates of the transistors are removed by the second gate cutting process and sidewalls of the insulator posts are revealed by portions of the second openings;
    after forming the second openings, forming dielectric liners in the second openings; and
    forming conductive posts on the dielectric liners, wherein the conductive posts fill the second openings, and the dielectric liners wrap the conductive posts such that the conductive posts are electrically insulated from the gates of the transistors.

9. The method as claimed in claim 8, wherein after forming the dielectric liners and the conductive posts, the insulator posts are spaced apart from the conductive posts by the dielectric liners.

10. The method as claimed in claim 9, wherein after forming the dielectric liners and the conductive posts, the dielectric liners are in contact with the insulator posts and the conductive posts.

11. The method as claimed in claim 8, wherein forming the dielectric liners and forming the conductive posts comprise:
depositing a dielectric material over the dielectric layer;
depositing a conductive material on the dielectric material, wherein the conductive material fills the second openings;
performing a first removal process to partially remove the conductive material and the dielectric material located outside the second openings; and
performing a second removal process to partially remove the conductive material located in the second openings until a top surface of the conductive material is lower than an upper edge of the second openings.

12. The method as claimed in claim 11, wherein the first removal process comprises a chemical mechanical polishing process, and the second removal process comprises an etch process.

13. The method as claimed in claim 8 further comprising:
forming at least one conductor electrically connected to bottom ends of the conductive posts.

14. The method as claimed in claim 8 further comprising:
removing third portions of gates of the transistors after forming the conductive posts on the dielectric liners.

15. A method for forming a semiconductor device, comprising:
forming transistors embedded in a dielectric layer disposed on a first surface of a semiconductor substrate;
performing a first gate cutting process to form first openings in the dielectric layer;
forming insulator posts in the first openings;
performing a second gate cutting process to form second openings in the dielectric layer;
forming power vias in the second openings;
forming an interconnect structure over the transistors, the dielectric layer and the power vias;
performing a thinning process from a second surface of the semiconductor substrate, the second surface being opposite to the first surface; and
forming a conductor penetrating through the semiconductor substrate, wherein the conductor is electrically connected to bottom ends of the power vias.

16. The method as claimed in claim 15, wherein the first gate cutting process is performed prior to the second gate cutting process.

17. The method as claimed in claim 16, wherein sidewalls of the insulator posts are revealed by portions of the second openings before forming the power vias.

18. The method as claimed in claim 15, wherein forming the power vias comprises:
depositing a dielectric material over the dielectric layer;
depositing a conductive material on the dielectric material, wherein the conductive material fills the second openings;
performing a first removal process to partially remove the conductive material and the dielectric material located outside the second openings; and
performing a second removal process to partially remove the conductive material located in the second openings until a top surface of the conductive material is lower than an upper edge of the second openings.

19. The method as claimed in claim 18, wherein the first removal process comprises a chemical mechanical polishing process, and the second removal process comprises an etch process.

20. The method as claimed in claim 15 further comprising:
removing third portions of gates of the transistors after forming the power vias.

* * * * *